United States Patent
Takahashi et al.

(10) Patent No.: US 11,859,119 B2
(45) Date of Patent: Jan. 2, 2024

(54) CHEMICAL LIQUID AND METHOD FOR TREATING OBJECT TO BE TREATED

(71) Applicant: FUJIFILM Corporation, Tokyo (JP)

(72) Inventors: Tomonori Takahashi, Shizuoka (JP); Yasuo Sugishima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/477,554

(22) Filed: Sep. 17, 2021

(65) Prior Publication Data

US 2022/0002622 A1     Jan. 6, 2022

Related U.S. Application Data

(63) Continuation of application No. PCT/JP2020/009076, filed on Mar. 4, 2020.

(30) Foreign Application Priority Data

Mar. 28, 2019    (JP) ................................. 2019-062243

(51) Int. Cl.
    *C09K 13/00*       (2006.01)
    *B08B 3/08*        (2006.01)
               (Continued)

(52) U.S. Cl.
    CPC ................ *C09K 13/00* (2013.01); *B08B 3/08* (2013.01); *C23F 1/34* (2013.01); *C23F 1/36* (2013.01);
               (Continued)

(58) Field of Classification Search
    CPC ... C09K 13/00; B08B 3/08; C23F 1/34; C23F 1/36; C23F 1/38; C23F 1/40; C23F 1/02;
               (Continued)

(56) References Cited

U.S. PATENT DOCUMENTS 3,749,575 A  *   7/1973   Willems .................... G03C 5/30
                                                      430/436
4,699,868 A  *   10/1987   Sabongi ................. G03C 5/315
                                                      430/405
(Continued)

FOREIGN PATENT DOCUMENTS

JP        2004535398      11/2004
JP        2006009006       1/2006
(Continued)

OTHER PUBLICATIONS

Byjus.com, Carboxyl group (Year: 2022).*
(Continued)

*Primary Examiner* — Duy Vu N Deo
(74) *Attorney, Agent, or Firm* — JCIPRNET

(57) ABSTRACT

The present invention provides a chemical liquid that causes a small variation in a dissolving amount of a first metal-containing substance in a case where the chemical liquid is applied to an object to be treated containing the first metal-containing substance. The present invention also provides a method for treating an object to be treated. The chemical liquid according to an embodiment of the present invention contains water, a hydroxylamine compound selected from the group consisting of hydroxylamine and a hydroxylamine salt, and a specific compound represented by Formula (1).

(1)

(Continued)

23 Claims, 1 Drawing Sheet

(51) Int. Cl.
*C23F 1/34* (2006.01)
*C23F 1/36* (2006.01)
*C23F 1/38* (2006.01)
*C23F 1/40* (2006.01)
*H01L 21/02* (2006.01)
*H01L 21/3213* (2006.01)

(52) U.S. Cl.
CPC ............. *C23F 1/38* (2013.01); *C23F 1/40* (2013.01); *H01L 21/02071* (2013.01); *H01L 21/32134* (2013.01)

(58) Field of Classification Search
CPC ...... C23F 1/16; C23F 1/28; C23F 1/32; C23F 1/44; H01L 21/02071; H01L 21/32134; H01L 21/02063
See application file for complete search history.

(56) References Cited

U.S. PATENT DOCUMENTS

| 9,796,953 | B2 | 10/2017 | Kumagai et al. |
| 2003/0087897 | A1 | 5/2003 | Tsukamoto et al. |
| 2006/0003910 | A1 | 1/2006 | Hsu et al. |
| 2006/0009525 | A1 | 1/2006 | Tsukamoto et al. |
| 2019/0177669 | A1 | 6/2019 | Kamimura et al. |

FOREIGN PATENT DOCUMENTS

| JP | 2009272601 | 11/2009 |
| JP | 2012069785 | 4/2012 |
| JP | 2013112666 | 6/2013 |
| JP | 2016090753 | 5/2016 |
| WO | 2018043440 | 3/2018 |

OTHER PUBLICATIONS

Aryl group, Wikipedia (Year: 2006).*
"International Search Report (Form PCT/ISA/210) of PCT/JP2020/009076," dated Jun. 2, 2020, with English translation thereof, pp. 1-5.
"Written Opinion of the International Searching Authority (Form PCT/ISA/237)" of PCT/JP2020/009076, dated Jun. 2, 2020, with English translation thereof, pp. 1-10.
"Office Action of Japan Counterpart Application" with English translation thereof, dated Sep. 20, 2022, p. 1-p. 8.
"Office Action of Taiwan Counterpart Application", issued on Nov. 9, 2023, with partial English translation thereof, p1-p8.

* cited by examiner

CHEMICAL LIQUID AND METHOD FOR TREATING OBJECT TO BE TREATED

CROSS-REFERENCE TO RELATED APPLICATIONS

This application is a Continuation of PCT International Application No. PCT/JP2020/009076 filed on Mar. 4, 2020, which claims priority under 35 U.S.C. § 119(a) to Japanese Patent Application No. 2019-062243 filed on Mar. 28, 2019. Each of the above applications is hereby expressly incorporated by reference, in its entirety, into the present application.

BACKGROUND OF THE INVENTION

1. Field of the Invention

The present invention relates to a chemical liquid and a method for treating an object to be treated.

2. Description of the Related Art

With the progress of miniaturization of semiconductor devices, the treatment in the semiconductor device manufacturing process, such as etching or washing using chemical liquids, is increasingly required to be more accurately performed with high efficiency.

For example, JP2016-090753A discloses a washing solution containing hydroxylamine.

SUMMARY OF THE INVENTION

Studies are conducted on a technique of etching (dissolving) a metal-containing substance (for example, a first metal-containing substance containing a metal selected from the group consisting of cobalt, ruthenium, molybdenum, aluminum, and copper) contained in an object to be treated by using a chemical liquid.

There are many objects to be treated in which the first metal-containing substance as a treatment target is at a plurality of sites. It is desirable that in a case where a chemical liquid is applied to such objects to be treated, the variation in an etching amount (dissolving amount) of the first metal-containing substance at each site is small. Hereinafter, "variation in an etching amount of the first metal-containing substance at each site" will be simply described as "variation in a dissolving amount of the first metal-containing substance", and a small variation in an etching amount (dissolving amount) of the first metal-containing substance at each site will be also described as "small variation in a dissolving amount of the first metal-containing substance".

The inventors of the present invention evaluated the above characteristics by using the chemical liquid described in JP2016-090753A. As a result, the inventors have found that further improvement is necessary.

The present invention has been made in consideration of the above circumstances, and an object thereof is to provide a chemical liquid that causes a small variation in a dissolving amount of a first metal-containing substance in a case where the chemical liquid is applied to an object to be treated containing the first metal-containing substance.

Another object of the present invention is to provide a method for treating an object to be treated.

In order to achieve the above objects, the inventors of the present invention conducted intensive studies. As a result, the inventors have found that the objects can be achieved by the following constitutions.

[1]
A chemical liquid containing water,
a hydroxylamine compound selected from the group consisting of hydroxylamine and a hydroxylamine salt, and
a specific compound represented by Formula (1) which will be described later.

[2]
The chemical liquid described in [1], in which a content of the specific compound is 0.1 ppm by mass to 10% by mass with respect to a total mass of the chemical liquid.

[3]
The chemical liquid described in [1] or [2], in which a content of the specific compound is 0.01% to 1% by mass with respect to a total mass of the chemical liquid.

[4]
The chemical liquid described in any one of [1] to [3], in which the specific compound includes two or more kinds of the specific compounds, and
a mass ratio of a content of a specific compound which takes up the highest proportion of the specific compounds to a content of a specific compound which takes up the second highest proportion of the specific compounds is 500 or less.

[5]
The chemical liquid described in any one of [1] to [4], in which the specific compound includes two or more kinds of specific compounds, and
a mass ratio of a content of a specific compound which takes up the highest proportion of the specific compounds to a content of a specific compound which takes up the second highest proportion of the specific compounds is 50 or less.

[6]
The chemical liquid described in any one of [1] to [5], in which a specific substituent in Formula (1) which will be described later is a group containing —CO—NH—OH.

[7]
The chemical liquid described in any one of [1] to [6], in which in Formula (1), one of $R^1$ to $R^3$ represents the specific substituent, and
the other two represent a group represented by Formula (2) which will be described later.

[8]
The chemical liquid described in any one of [1] to [7], in which a content of the hydroxylamine compound is 0.1% to 18% by mass with respect to a total mass of the chemical liquid.

[9]
The chemical liquid described in any one of [1] to [8], in which a mass ratio of a content of the hydroxylamine compound to a content of the specific compound is $2.0 \times 10^{-4}$ to $1.5 \times 10^5$.

[10]
The chemical liquid described in any one of [1] to [9], further containing a chelating agent which is a compound other than the specific compound.

[11]
The chemical liquid described in [10], in which a content of the chelating agent is 0.1% to 15% by mass with respect to a total mass of the chemical liquid.

[12]

The chemical liquid described in [10] or [11], in which a content of the chelating agent is more than 0.2% by mass and 1% by mass or less with respect to a total mass of the chemical liquid.

[13]

The chemical liquid described in any one of [10] to [12], in which a mass ratio of a content of the chelating agent to a content of the specific compound is $1.0\times10^0$ to $5.0\times10^5$.

[14]

The chemical liquid described in any one of [10] to [13], in which a mass ratio of a content of the chelating agent to a content of the specific compound is $7.0\times10^0$ to $5.0\times10^1$.

[15]

The chemical liquid described in any one of [10] to [14], in which the chelating agent has a functional group selected from the group consisting of a carboxylic acid group, a phosphonic acid group, and a sulfonic acid group.

[16]

The chemical liquid described in any one of [10] to [15], in which the chelating agent is selected from the group consisting of citric acid, diethylenetriaminepentaacetic acid, ethylenediaminetetraacetic acid, trans-1,2-diaminocyclohexanetetraacetic acid, oxalic acid, malonic acid, succinic acid, methanesulfonic acid, 1-hydroxyethylidene-1,1-diphosphonic acid, and nitrilotrismethylenephosphonic acid.

[17]

The chemical liquid described in any one of [10] to [16], in which the chelating agent is citric acid.

[18]

The chemical liquid described in any one of [1] to [17], which is used for an object to be treated containing a first metal-containing substance containing a metal selected from the group consisting of cobalt, ruthenium, molybdenum, aluminum, and copper.

[19]

The chemical liquid described in [18], in which the first metal-containing substances is a simple metal, an oxide, or a nitride of one kind of metal selected from the group consisting of cobalt, ruthenium, molybdenum, aluminum, and copper, or an alloy, a composite oxide, or a composite nitride of two or more kinds of metals selected from the above group.

[20]

The chemical liquid described in [18] or [19], in which the first metal-containing substance is simple cobalt, a cobalt alloy, a cobalt oxide, or a cobalt nitride.

[21]

The chemical liquid described in any one of [18] to [20], in which the object to be treated contains at least two or more kinds of the first metal-containing substance, or the object to be treated contains the first metal-containing substance and a second metal-containing substance which is a material different from the first metal-containing substance and contains a metal.

[22]

The chemical liquid described in [21], in which the object to be treated contains at least two kinds of the first metal-containing substances, some of which form a combination in which an absolute value of a difference in a corrosion potential between the first metal-containing substances in the chemical liquid is 0.3 V or less, or the object to be treated contains the first metal-containing substance and the second metal-containing substance in which an absolute value of a difference between a corrosion potential of the first metal-containing substance in the chemical liquid and a corrosion potential of the second metal-containing substance in the chemical liquid is 0.3 V or less.

[23]

The chemical liquid described in [21] or [22], in which the second metal-containing substance is a simple metal, an oxide, or a nitride of one kind of metal selected from the group consisting of titanium and tantalum, or an alloy, a composite oxide, or a composite nitride of two or more kinds of metals selected from the above group.

[24]

The chemical liquid described in any one of [21] to [23], in which the second metal-containing substance is simple titanium, a titanium oxide, or a titanium nitride.

[25]

A method for treating an object to be treated, including bringing an object to be treated containing a first metal-containing substance containing a metal selected from the group consisting of cobalt, ruthenium, molybdenum, aluminum, and copper into contact with the chemical liquid described in any one of [1] to [24] so that the first metal-containing substance is dissolved.

[26]

The method for treating an object to be treated described in [25], including a step A of bringing the object to be treated containing the first metal-containing substance and a second metal-containing substance which is a material different from the first metal-containing substance and contains a metal into contact with the chemical liquid so that the first metal-containing substance is dissolved, and a step B of bringing the object to be treated into contact with a solution selected from the group consisting of a mixed aqueous solution of ammonia and aqueous hydrogen peroxide, a mixed aqueous solution of hydrofluoric acid and aqueous hydrogen peroxide, a mixed aqueous solution of sulfuric acid and aqueous hydrogen peroxide, and a mixed aqueous solution of hydrochloric acid and aqueous hydrogen peroxide before or after the step A so that the second metal-containing substance is dissolved.

[27]

The method for treating an object to be treated described in [26], in which the step A and the step B are alternately repeated.

[28]

The method for treating an object to be treated described in any one of [25] to [27], in which a temperature of the chemical liquid is 20° C. to 75° C.

[29]

A method for treating an object to be treated, including bringing the chemical liquid described in any one of [1] to [24] into contact with an object to be treated containing a first metal-containing substance which contains a metal selected from the group consisting of cobalt, ruthenium, molybdenum, aluminum, and copper and dry etching residues which are on a surface of the object to be treated, so that the first metal-containing substance is dissolved, and the dry etching residues on the surface of the object to be treated are removed.

According to an aspect of the present invention, it is possible to provide a chemical liquid that causes a small variation in a dissolving amount of a first metal-containing substance in a case where the chemical liquid is applied to an object to be treated containing the first metal-containing substance.

Furthermore, according to an aspect of the present invention, it is possible to provide a method for treating an object to be treated.

DESCRIPTION OF THE PREFERRED EMBODIMENTS

Figure 1:
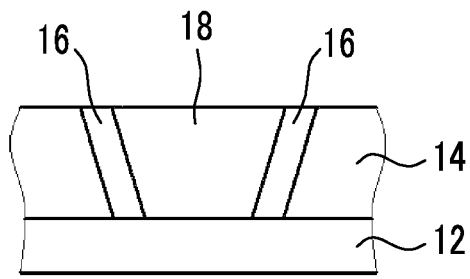
FIG. 1 is a cross-sectional view showing an embodiment of an object to be treated.

Hereinafter, the present invention will be specifically described.

The following constituents will be described based on typical embodiments of the present invention in some cases, but the present invention is not limited to the embodiments.

In the present specification, the range of numerical values described using "to" means a range including the numerical values listed before and after "to" as the lower limit and the upper limit.

Furthermore, in the present invention, "ppm" means "parts-per-million ($10^{-6}$)", "ppb" means "parts-per-billion ($10^{-9}$)", and "ppt" means "parts-per-trillion ($10^{-12}$)".

In the present specification, "room temperature" is "25° C.".

In the present specification, the pH of the chemical liquid is a value measured at room temperature (25° C.) by using F-51 (trade name) manufactured by Horiba, Ltd.

[Chemical Liquid]

The chemical liquid according to an embodiment of the present invention contains water, a hydroxylamine compound selected from the group consisting of hydroxylamine and a hydroxylamine salt, and a specific compound represented by Formula (1) which will be described later.

It is unclear what mechanism works for the chemical liquid constituted as above to achieve the above objects. According to the inventors of the present invention, the mechanism is assumed to be as below.

The chemical liquid according to the embodiment of the present invention contains both the hydroxylamine compound and the specific compound. Presumably, as a result, in the presence of the hydroxylamine compound capable of acting as a reducing agent, the specific compound containing a double bond and an amide group could interact with the surface of the first metal-containing substance, which may bring about the desired effect.

Furthermore, the chemical liquid according to the embodiment of the present invention excellently dissolves the first metal-containing substance and excellently improves the smoothness (roughness) of the surface of a metal-containing substance after being used for dissolving the first metal-containing substance.

Hereinafter, the characteristics of the chemical liquid according to the embodiment of the present invention, such as reducing the variation in the dissolving amount of the first metal-containing substance, excellently dissolving the first metal-containing substance, and/or being capable of improving the smoothness (roughness) of the surface of a metal-containing substance after being used for dissolving the first metal-containing substance, will be described as "improving the effects of the present invention" as well.

Hereinafter, the components contained in the chemical liquid according to the embodiment of the present invention (hereinafter, also simply called "chemical liquid") will be specifically described.

<Water>

The chemical liquid contains water.

The water is not particularly limited, and examples thereof include distilled water, deionized water, and pure water.

The content of water in the chemical liquid is not particularly limited. The content of water with respect to the total mass of the chemical liquid is preferably 50% by mass or more, more preferably 70% by mass or more, and even more preferably 80% by mass or more. The upper limit of the content of water is less than 100% by mass.

<Hydroxylamine Compound>

The chemical liquid contains a hydroxylamine compound selected from the group consisting of hydroxylamine and a hydroxylamine salt.

"Hydroxylamine" for the hydroxylamine compound refers to hydroxylamine compounds including substituted or unsubstituted alkylhydroxylamine and the like in a broad sense. Any of the hydroxylamine compounds can bring about the effects of the present invention.

The hydroxylamine compound is not particularly limited, but unsubstituted hydroxylamine, a hydroxylamine derivative, and a salt thereof are preferable.

Examples of hydroxylamine derivatives include O-methylhydroxylamine, O-ethylhydroxylamine, N-methylhydroxylamine, N,N-dimethylhydroxylamine, N,O-dimethylhydroxylamine, N-ethylhydroxyl amine, N,N-diethylhydroxylamine, N,O-diethylhydroxyl amine, O,N,N-trimethylhydroxylamine, N,N-dicarboxyethylhydroxylamine, and N,N-disulfoethylhydroxylamine.

As the salt of the unsubstituted hydroxylamine or hydroxylamine derivative, an inorganic or organic salt of the aforementioned unsubstituted hydroxylamine or hydroxylamine derivative is preferable, a salt of an inorganic acid formed by binding of a non-metal atom, such as Cl, S, N, or P, to a hydrogen atom is more preferable, and a salt of any of hydrochloric acid, sulfuric acid, and nitric acid is even more preferable. Among these, hydroxylamine nitrate, hydroxylamine sulfate, hydroxylamine hydrochloride, hydroxylamine phosphate, N,N-diethylhydroxylamine sulfate, N,N-diethylhydroxylamine nitrate, or a mixture of these is preferable.

Examples of the aforementioned organic acid salt of the unsubstituted hydroxylamine or hydroxylamine derivative include hydroxylammonium citrate, hydroxylammonium oxalate, hydroxylammonium fluoride, and the like.

Among these, in view of further improving the effects of the present invention, hydroxylamine, hydroxylamine sulfate, hydroxylamine hydrochloride, hydroxylamine phosphate, hydroxylamine nitrate, or N,N-diethylhydroxylamine is preferable, and hydroxylamine is more preferable.

The content of the hydroxylamine compound is not particularly limited. In view of further improving the effects of the present invention, the content of the hydroxylamine compound with respect to the total mass of the chemical liquid is preferably 0.001% to 20% by mass, and more preferably 0.1% to 18% by mass.

One kind of hydroxylamine compound may be used alone, or two or more kinds of hydroxylamine compounds may be used. In a case where two or more kinds of hydroxylamine compounds are used, the total amount thereof is preferably within the above range.

<Specific Compound>

The chemical liquid contains a specific compound represented by Formula (1).

The specific compound is assumed to interact with the surface of the first metal-containing substance. In a case where the chemical liquid contains the specific compound, the desired effect can be obtained.

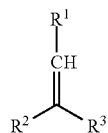 (1)

In Formula (1), $R^1$ to $R^3$ each independently represent a hydrogen atom or a substituent.

Here, at least one of $R^1$, $R^2$, or $R^3$ represents a specific substituent containing —CO—NH—.

In other words, one to three of $R^1$ to $R^3$ represent the specific substituent, and the others represent a hydrogen atom or a substituent other than the specific substituent (non-specific substituent).

The specific substituent is a group containing —CO—NH—. The direction of binding of —CO—NH— is not particularly limited. For example, —CO— of —CO—NH— may be on the double bond side specified in Formula (1), or —NH— of —CO—NH— may be on the double bond side specified in Formula (1).

Particularly, it is preferable that —CO— of —CO—NH— be on the double bond side specified in Formula (1).

Furthermore, the number of —CO—NH— present in the specific substituent is not limited, and is preferably 1 to 5 and more preferably 1.

In view of further improving the effects of the present invention, the specific substituent is preferably a group represented by Formula (T).

-$L^T$-CO—NH—$R^T$

In Formula (T), $L^T$ represents a single bond or a divalent linking group.

Examples of the divalent linking group include an ether group (—O—), a carbonyl group (—CO—), an ester group (—COO—), a thioether group (—S—), —$SO_2$—, —$NR^N$— ($R^N$ represents a hydrogen atom or an alkyl group), a divalent hydrocarbon group (an alkylene group, an alkenylene group (such as —CH=CH—), an alkynylene group (such as —C≡C—), or an arylene group), —$SiR^{SX}_2$— ($R^{SN}$ represents a hydrogen atom or a substituent), and a group formed by combining one or more groups selected from the group consisting of the above groups. These groups may have a substituent if possible, or may not have a substituent.

Particularly, as the aforementioned divalent linking group, a divalent hydrocarbon group having 1 to 10 carbon atoms is preferable, an alkylene group is more preferable, and a methylene group is even more preferable.

In Formula (T), $R^T$ represents a hydrogen atom or a substituent. $R^T$ is preferably a hydrogen atom or a hydroxyl group, and more preferably a hydroxyl group. That is, the specific substituent is preferably a group containing —CO—NH—OH.

In view of further improving the effects of the present invention, one of $R^1$ to $R^3$ in Formula (1) is preferably the specific substituent.

In view of further improving the effects of the present invention, it is preferable that one or two of $R^1$ to $R^3$ in Formula (1) be the non-specific substituent, and it is more preferable that two of $R^1$ to $R^3$ in Formula (1) be the non-specific substituent.

The non-specific substituent is a substituent that does not contain —CO—NH—.

In view of further improving the effects of the present invention, the non-specific substituent is preferably a group represented by Formula (2).

-$L^2$-COOH (2)

In Formula (2), $L^2$ represents a single bond or a divalent linking group.

Examples of the divalent linking group represented by $L^2$ in Formula (2) are the same as the examples of the divalent linking group represented by $L^T$ in Formula (T), and preferred forms of the divalent linking group are also the same. Here, the divalent linking group represented by $L^2$ does not contain —CO—NH—.

In Formula (1), $R^1$ and $R^2$ may be bonded to each other to form an aromatic ring which may have a substituent.

The aromatic ring which is formed by the bonding of $R^1$ and $R^2$ and may have a substituent may be a monocyclic ring or a polycyclic ring, and is preferably a monocyclic ring. The aromatic ring may or may not have a heteroatom (such as an oxygen atom, a sulfur atom, and/or a nitrogen atom). It is preferable that the aromatic ring do not have a heteroatom. The number of atoms as members of the aromatic ring is preferably 5 to 12, more preferably 6. The aromatic ring may have a substituent other than $R^3$ if possible, or may not have such a substituent. It is preferable that the aromatic ring do not have such a substituent.

In a case where $R^1$ and $R^2$ are bonded to each other to form an aromatic ring which may have a substituent, $R^3$ represents the aforementioned specific substituent.

Especially, it is preferable that the chemical liquid contain one or more kinds of compounds among the following compounds A to C as the specific compound. It does not matter whether each of the following compounds A to C is a cis isomer or a trans isomer.

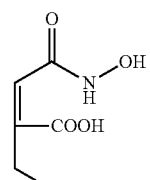

Compound A

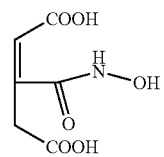

Compound B

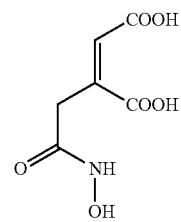

Compound C

In view of further improving the effects of the present invention, the content of the specific compound with respect to the total mass of the chemical liquid is preferably 0.10 ppm by mass to 10% by mass, and more preferably 0.01% to 1% by mass.

One kind of specific compound may be used alone, or two or more kinds of specific compounds may be used. In a case where two or more kinds of specific compounds are used, the total amount thereof is within the above range.

In the present specification, in a case where the specific compound includes cis and trans isomers (for example, in a case where the specific compound includes cis and trans isomers distinguished based on the C=C double bond specified in Formula (1)), all of the specific compounds including cis and trans isomers that differ from each other only in terms of the structure are regarded as one kind of specific compound.

For example, the compound A may include either or both of a compound in which "—CO—NH—OH" and "—COOH" bonded to a C=C double bond are arranged at cis position (cis isomer) and a compound in which "—CO—NH—OH" and "—COOH" are arranged at trans position (trans isomer). In a case where the chemical liquid contains, as the specific compound, the compound A as a cis isomer and the compound A as a trans isomer, the chemical liquid is considered as having only one kind of specific compound.

It is preferable that the chemical liquid contain two or more kinds of specific compounds.

In a case where the chemical liquid contains two or more kinds of specific compounds, the mass ratio of the content of a specific compound which takes up the highest proportion of the specific compounds to the content of a specific compound which takes up the second highest proportion of the specific compounds (content of specific compound which takes up the highest proportion of specific compounds/content of specific compound which takes up the second highest proportion of specific compounds) is preferably 500 or less, and more preferably 50 or less.

In a case where "content of a specific compound which takes up the highest proportion of the specific compounds" and "content of a specific compound which takes up the second highest proportion of the specific compounds" are very close to each other, the mass ratio may be 1. That is, "content of a specific compound which takes up the highest proportion of the specific compounds" and "content of a specific compound which takes up the second highest proportion of the specific compounds" may be substantially the same amount.

In a case where the chemical liquid contains two or more kinds of specific compounds, it is also preferable that at least one kind of specific compound be the compound A.

In this case, the mass ratio of the content of the compound A to the content of a specific compound which is not the compound A and takes up the highest proportion of the specific compounds is preferably 0.001 to 500, and more preferably 0.01 to 50.

In view of further improving the effects of the present invention, the mass ratio of the content of the hydroxylamine compound to the content of the specific compound (content of hydroxylamine compound/content of specific compound) is preferably $1.0 \times 10^{-6}$ to $1.0 \times 10^{8}$, and more preferably $2.0 \times 10^{-4}$ to $1.5 \times 10^{6}$.

The chemical liquid may contain components other than water, the hydroxylamine compound, and the specific compound.

<Chelating Agent>

The chemical liquid may contain a chelating agent. In a case where the chemical liquid contains a chelating agent, the chemical liquid exhibits higher etching performance to the first metal-containing substance.

The chelating agent means an acid capable of functioning as a chelating ligand. As the chelating agent, a compound having one or more acid groups is preferable. The chelating agent does not include the specific compound and a reducing agent different from hydroxylamine which will be described later.

The acid group is not particularly limited, and is preferably at least one kind of functional group selected from the group consisting of a carboxylic acid group, a sulfonic acid group, and a phosphonic acid group.

Examples of the chelating agent having a carboxylic acid group include polyaminopolycarboxylic acids, aliphatic dicarboxylic acids, aliphatic polycarboxylic acids containing a hydroxyl group, and ascorbic acids.

The polyaminopolycarboxylic acids are compounds having a plurality of amino groups and a plurality of carboxylic acid groups. Examples thereof include mono- or polyalkylene polyamine polycarboxylic acid, polyaminoalkane polycarboxylic acid, polyaminoalkanol polycarboxylic acid, and hydroxyalkyl ether polyamine polycarboxylic acid.

Examples of the polyaminopolycarboxylic acids include butylenediaminetetraacetic acid, diethylenetriaminepentaacetic acid (DTPA), ethylenediaminetetrapropionic acid, triethylenetetraminehexacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanol tetraacetic acid, and (hydroxyethyl)ethylenediaminetriacetic acid. Among these, diethylenetriaminepentaacetic acid (DTPA), ethylenediaminetetraacetic acid (EDTA), or trans-1,2-diaminocyclohexanetetraacetic acid is preferable.

Examples of the aliphatic dicarboxylic acids include oxalic acid, malonic acid, succinic acid, and maleic acid. Among these, oxalic acid, malonic acid, or succinic acid is preferable.

Examples of the aliphatic polycarboxylic acids containing a hydroxyl group include malic acid, tartaric acid, and citric acid. Among these, citric acid is preferable.

Examples of ascorbic acids include ascorbic acid, isoascorbic acid, ascorbic acid sulfate, ascorbic acid phosphate, ascorbic acid 2-glucoside, ascorbic acid palmitate, ascorbyl tetraisopalmitate, ascorbic acid isopalminate, and ascorbic acids of these salts and the like. Among these, ascorbic acid is preferable.

Examples of the chelating agent having a sulfonic acid group include methanesulfonic acid.

Examples of the chelating agent having a phosphonic acid group include methyldiphosphonic acid, aminotri(methylenephosphonic acid), 1-hydroxyethylidene-1,1-diphosphonic acid, nitrilotrismethylenephosphonic acid (NTMP), ethylenediaminetetrakis(methylenephosphonic acid) (EDTPO), hexamethylenediaminetetra(methylenephosphonic acid), propylenediaminetetra(methylenephosphonic acid), diethylenetriaminepenta(methylenephosphonic acid), triethylenetetraminehexa(methylenephosphonic acid), triaminotriethylaminehexa(methylenephosphonic acid), trans-1,2-cyclohexanediaminetetra(methylenephosphonic acid), glycol ether diaminetetra(methylenephosphonic acid), tetraethylenepentaminehepta(methylenephosphonic acid), and glycine-N,N-bis(methylenephosphonic acid) (glyphosine).

In view of further improving the effects of the present invention, the chelating agent is preferably a compound selected from the group consisting of citric acid, diethylenetriaminepentaacetic acid, ethylenediaminetetraacetic acid, trans-1,2-diaminocyclohexanetetraacetic acid, oxalic acid, malonic acid, succinic acid, methanesulfonic acid, 1-hydroxyethylidene-1,1-diphosphonic acid, and nitrilotrismethylenephosphonic acid, and more preferably citric acid.

In a case where the chemical liquid contains a chelating agent, in view of further improving the effects of the present invention, the content of the chelating agent (particularly in a case where the first metal-containing substance is a cobalt-containing substance such as simple cobalt, a cobalt alloy, a cobalt oxide, or a cobalt nitride) with respect to the total mass of the chemical liquid is preferably 0.01% to 20% by mass, more preferably 0.1% to 15% by mass, even more preferably 0.1% to 5% by mass, and particularly preferably more than 0.2% by mass and 1% by mass or less.

In a case where the first metal-containing substance is a ruthenium-containing substance (such as simple ruthenium, a ruthenium alloy, a ruthenium oxide, or a ruthenium nitride), the content of the chelating agent is preferably 10% to 20% by mass with respect to the total mass of the chemical liquid.

In a case where the first metal-containing substance is a molybdenum-containing substance (such as simple molybdenum, a molybdenum alloy, a molybdenum oxide, or a molybdenum nitride), the content of the chelating agent is preferably 0.5% to 15% by mass with respect to the total mass of the chemical liquid.

In a case where the first metal-containing substance is an aluminum-containing substance (such as simple aluminum, an aluminum alloy, an aluminum oxide, or a aluminum nitride), the content of the chelating agent is preferably more than 0.2% by mass and 20% by mass or less (more preferably 5% to 15% by mass) with respect to the total mass of the chemical liquid.

In a case where the first metal-containing substance is a copper-containing substance (such as simple copper, a copper alloy, a copper oxide, or a copper nitride), the content of the chelating agent is preferably more than 0.2% by mass and 1% by mass or less with respect to the total mass of the chemical liquid.

One kind of chelating agent may be used alone, or two or more kinds of chelating agents may be used. In a case where two or more kinds of chelating agents are used, the total amount thereof is preferably within the above range.

In view of further improving the effects of the present invention, the mass ratio of the content of the chelating agent to the content of the specific compound (content of chelating agent/content of specific compound) is (particularly in a case where the first metal-containing substance is a cobalt-containing substance) preferably $1.0 \times 10^{-2}$ to $5.0 \times 10^{6}$, more preferably $1.0 \times 10^{0}$ to $5.0 \times 10^{4}$, and even more preferably $7.0 \times 10^{0}$ to $5.0 \times 10^{1}$.

In a case where the first metal-containing substance is a molybdenum-containing substance, the above mass ratio is preferably $1.5 \times 10^{1}$ to $5.0 \times 10^{2}$.

In a case where the first metal-containing substance is a ruthenium-containing substance, the above mass ratio is preferably $1.0 \times 10^{2}$ to $1.0 \times 10^{3}$.

In a case where the first metal-containing substance is an aluminum-containing substance, the above mass ratio is preferably $7.0 \times 10^{0}$ to $5.0 \times 10^{3}$ (more preferably $1.0 \times 10^{2}$ to $1.0 \times 10^{3}$).

In a case where the first metal-containing substance is a copper-containing substance, the above mass ratio is preferably $7.0 \times 10^{0}$ to $5.0 \times 10^{1}$.

<Metal Component>

The chemical liquid may contain a metal component.

Examples of the metal component include metal particles and metal ions. For example, the content of the metal component means the total content of metal particles and metal ions.

The chemical liquid may contain either metal particles or metal ions, or may contain both of them. It is preferable that the chemical liquid contain both the metal particles and metal ions.

Examples of the metal atom contained in the metal component include metal atoms selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, and Zn.

The metal component may contain one kind of metal atom or two or more kinds of metal atoms.

The metal particles may be a simple metal or an alloy, and may be in the form of particles in which a metal and an organic substance are aggregated.

The metal component may be a metal component which is inevitably incorporated into each component (raw material) of the chemical liquid or a metal component inevitably incorporated into the chemical liquid during the manufacturing, storage, and/or transfer of the chemical liquid. Alternatively, the metal component may be intentionally added.

In a case where the chemical liquid contains a metal component, the content of the metal component is usually 0.01 ppt by mass to 10 ppm by mass with respect to the total mass of the chemical liquid. In view of further improving the effects of the present invention, the content of the metal component is preferably 0.1 ppt by mass to 1 ppm by mass, and more preferably 0.01 ppb by mass to 100 ppb by mass.

The mass ratio of the content of the metal component to the content of the specific compound is not particularly limited, and is usually $10^{-9}$ to $10^{8}$. In view of further improving the effects of the present invention, the mass ratio is preferably $10^{-8}$ to $10^{7}$.

The type and content of the metal component in the chemical liquid can be measured by single nano particle inductively coupled plasma mass spectrometry (SP-ICP-MS).

The device used in SP-ICP-MS is the same as the device used in general inductively coupled plasma mass spectrometry (ICP-MS). The only difference between SP-ICP-MS and ICP-MS is how to analyze data. With SP-ICP-MS, data can be analyzed using commercial software.

With ICP-MS, the content of a metal component as a measurement target is measured regardless of the way the metal component is present. Accordingly, the total mass of metal particles and metal ions as a measurement target is quantified as the content of the metal component.

With SP-ICP-MS, the content of metal particles can be measured. Accordingly, by subtracting the content of the metal particles from the content of the metal component in a sample, the content of metal ions in the sample can be calculated.

Examples of the device for SP-ICP-MS include Agilent 8800 triple quadrupole inductively coupled plasma mass spectrometry (ICP-MS, for semiconductor analysis, option #200) manufactured by Agilent Technologies, Inc. By using this device, the content of the metal-containing particles can be measured by the method described in Examples. In addition to the device described above, it is possible to use NexION350S manufactured by PerkinElmer Inc. and Agilent 8900 manufactured by Agilent Technologies, Inc.

<Reducing Agent Different from Hydroxylamine Compound>

The chemical liquid may contain a reducing agent different from the hydroxylamine compound. Here, the chelating agent is not included in the reducing agent different from the hydroxylamine compound.

The reducing agent different from the hydroxylamine compound is not particularly limited. The reducing agent is preferably a reducing substance such as a compound having a OH group or a CHO group or a compound containing a sulfur atom. The reducing agent is oxidative and has a function of oxidizing OW ions, dissolved oxygen, and the like which cause decomposition of the hydroxylamine compound.

Among the reducing substances such as the compound having a OH group or a CHO group and the compound containing a sulfur atom, one kind of compound selected from the group consisting of a compound represented by Formula (4) and a compound having a sulfur atom is preferable.

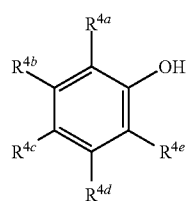

(4)

In Formula (4), $R^{4a}$ to $R^{4e}$ each independently represent a hydrogen atom, a hydroxyl group, or a hydrocarbon group which may have a heteroatom. In a case where $R^{4a}$ to $R^{4e}$ have a hydrocarbon group which may have a heteroatom, the hydrocarbon group may have a substituent.

Examples of the hydrocarbon group represented by $R^{4a}$ to $R^{4e}$ in Formula (4) that may have a heteroatom include a hydrocarbon group and a hydrocarbon group having a heteroatom.

Examples of the hydrocarbon group represented by $R^{4a}$ to $R^{4e}$ include an alkyl group (preferably having 1 to 12 carbon atoms, and more preferably having 1 to 6 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and even more preferably having 6 to 10 carbon atoms), and an aralkyl group (preferably having 7 to 23 carbon atoms, more preferably having 7 to 15 carbon atoms, and even more preferably having 7 to 11 carbon atoms).

Examples of the hydrocarbon group represented by $R^{4a}$ to $R^{4e}$ having a heteroatom include a group formed in a case where —$CH_2$— in the aforementioned hydrocarbon group is substituted, for example, with one kind of substituent selected from the group consisting of —O—, —S—, —CO—, —$SO_2$—, and —$NR^a$— or with a divalent group formed by combining two or more substituents among the above. $R^a$ represents a hydrogen atom or a hydrocarbon group having 1 to 20 carbon atoms (preferably an alkyl group having 1 to 5 carbon atoms).

Examples of substituents include a hydroxyl group, a carboxyl group, and a substituted or unsubstituted amino group (the substituent is preferably an alkyl group having 1 to 6 carbon atoms and more preferably an alkyl group having 1 to 3 carbon atoms).

Examples of the compound represented by Formula (4) include gallic acid, resorcinol, ascorbic acid, tert-butylcatechol, catechol, isoeugenol, o-methoxyphenol, 4,4'-dihydroxyphenyl-2,2-propane, isoamyl salicylate, benzyl salicylate, methyl salicylate, and 2,6-di-t-butyl-p-cresol.

In view of adding reducing properties, the compound represented by Formula (4) preferably has two or more hydroxyl groups, and more preferably has three or more hydroxyl groups. The position of substitution with a hydroxyl group is not particularly limited. In view of adding reducing properties, the position is preferably $R^{4a}$ and/or $R^{4b}$.

Examples of the compound represented by Formula (4) having two or more hydroxyl groups include catechol, resorcinol, tert-butylcatechol, and 4,4'-dihydroxyphenyl-2,2-propane. Examples of the compound represented by Formula (4) having three or more hydroxyl groups include gallic acid.

Examples of the compound containing a sulfur atom include mercaptosuccinic acid, dithiodiglycerol [$S(CH_2CH(OH)CH_2(OH))_2$], bis(2,3-dihydroxypropylthio)ethylene [$CH_2CH_2(SCH_2CH(OH)CH_2(OH))_2$], sodium 3-(2,3-dihydroxypropylthio)-2-methyl-propylsulfonate [$CH_2(OH)CH(OH)CH_2SCH_2CH(CH_3)CH_2SO_3Na$], 1-thioglycerol [$HSCH_2CH(OH)CH_2(OH)$], sodium 3-mercapto-1-propane-sulfonate [$HSCH_2CH_2CH_2SO_3Na$], 2-mercaptoethanol [$HSCH_2CH_2(OH)$], thioglycolic acid [$HSCH_2CO_2H$], and 3-mercapto-1-propanol [$HSCH_2CH_2CH_2OH$]. Among these, a compound having a SH group (mercapto compound) is preferable, 1-thioglycerol, sodium 3-mercapto-1-propane-sulfonate, 2-mercaptoethanol, 3-mercapto-1-propanol, or thioglycolic acid is more preferable, and 1-thioglycerol or thioglycolic acid is even more preferable.

One kind of reducing agent different from the hydroxylamine compound may be used alone, or two or more kinds of such reducing agents may be used in combination.

<pH Adjuster>

The chemical liquid may contain a pH adjuster other than the components described above. Examples of the pH adjuster include an acid compound and a base compound.

(Acid Compound)

Examples of the acid compound include sulfuric acid, hydrochloric acid, acetic acid, nitric acid, hydrofluoric acid, perchloric acid, hypochlorous acid, and periodic acid.

(Base Compound)

Examples of the base compound include aqueous ammonia, an amine compound different from a hydroxylamine compound, and a quaternary ammonium hydroxide salt.

Examples of the amine compound different from a hydroxylamine compound include a cyclic compound (a compound having a cyclic structure). Examples of the cyclic compound include an amine compound having a cyclic structure that will be described later.

The quaternary ammonium hydroxide salt is not included in the amine compound different from a hydroxylamine compound.

As the amine compound different from a hydroxylamine compound, an amine compound having a cyclic structure is preferable.

In the amine compound having a cyclic structure, an amino group may be in either or both of the aforementioned cyclic structure and any position other than the cyclic structure.

Examples of the amine compound having a cyclic structure include tetrahydrofurfurylamine, N-(2-aminoethyl)piperazine, 1,8-diazabicyclo[5.4.0]-7-undecene, 1,4-diazabicyclo[2.2.2]octane, hydroxyethyl piperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4,3,0]-5-nonene.

As the amine compound, among these, tetrahydrofurfurylamine, N-(2-aminoethyl)piperazine, 1,8-diazabicyclo[5.4.0]-7-undecene, or 1,4-diazabicyclo[2.2.2]octane is preferable.

In a case where the chemical liquid contains the amine compound different from a hydroxylamine compound, the content of the amine compound different from a hydroxylamine compound with respect to the total mass of the chemical liquid is preferably 0.1% to 50% by mass, and more preferably 0.5% to 30% by mass.

Examples of the quaternary ammonium hydroxide salt include a compound represented by Formula (5).

(5)

In Formula (5), $R^{5a}$ to $R^{5d}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{5a}$ to $R^{5d}$ may be bonded to each other to form a cyclic structure. Particularly, the groups in at least either a combination of $R^{5a}$ and $R^{5b}$ or a combination of $R^{5c}$ and $R^{5d}$ may be bonded to each other to form a cyclic structure.

As the compound represented by Formula (5), tetramethylammonium hydroxide, tetraethylammonium hydroxide, tetrapropylammonium hydroxide, tetrabutylammonium hydroxide, methyltripropylammonium hydroxide, methyltributylammonium hydroxide, ethyltrimethylammonium, dimethyldiethylammonium hydroxide, benzyltrimethylammonium hydroxide, hexadecyltrimethylammonium hydroxide, or (2-hydroxyethyl)trimethylammonium hydroxide is preferable.

In a case where the chemical liquid contains a quaternary ammonium hydroxide salt, the content of the quaternary ammonium hydroxide salt with respect to the total mass of the chemical liquid is preferably 0.05% to 10% by mass, and more preferably 0.1% to 5% by mass.

As the base compound, a water-soluble amine other than the above compounds can also be used.

A pka of the water-soluble amine is preferably 7.5 to 13.0 at room temperature. In the present specification, the water-soluble amine means an amine which can dissolve in an amount of 50 g or more in 1 L of water at room temperature. Aqueous ammonia is not included in the water-soluble amine.

Examples of the water-soluble amine having a pKa of 7.5 to 13 include diglycolamine (DGA) (pKa=9.80), methylamine (pKa=10.6), ethylamine (pKa=10.6), propylamine (pKa=10.6), butylamine (pKa=10.6), pentylamine (pKa=10.0), ethanolamine (@Ka=9.3), propanolamine (pKa=9.3), butanol amine (pKa=9.3), methoxyethylamine (pKa=10.0), methoxypropylamine (pKa=10.0), dimethylamine (pKa=10.8), diethylamine (pKa=10.9), dipropylamine (pKa=10.8), trimethylamine (pKa=9.80), and triethylamine @Ka=10.72).

As the water-soluble amine, unsubstituted hydroxylamine and a hydroxylamine derivative may also be used.

In the present specification, the pka of the water-soluble amine is an acid dissociation constant in water. The acid dissociation constant in water can be measured using a spectrometer and potentiometry in combination.

As the pH adjuster, particularly, one or more kinds of compounds are preferable which are selected from the group consisting of sulfuric acid, hydrochloric acid, acetic acid, nitric acid, hydrofluoric acid, perchloric acid, hypochlorous acid, periodic acid, tetramethylammonium hydroxide, tetraethylammonium hydroxide, tetrabutylammonium hydroxide, aqueous ammonia, and a water-soluble amine.

<Anticorrosive>

The chemical liquid may contain an anticorrosive. The anticorrosive has a function of preventing overetching of the object to be treated. The anticorrosive mentioned herein does not include the aforementioned reducing agent different from hydroxylamine and the chelating agent.

The anticorrosive is not particularly limited, and examples thereof include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, 3-amino-5-mercapto-1,2,4-triazole, 1-amino-1,2,4-triazole, 1-amino-1,2,3-triazole, 1-amino-5-methyl-1,2,3-triazole, 3-mereapto-1,2,4-triazole, 3-isopropyl-1,2,4-triazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, 2,3,5-trimethylpyrazine, 2-ethyl-3,5-dimethylpyrazine, quinoxaline, acetylpyrrole, pyridazine, and pyrazine.

Furthermore, as the anticorrosive, benzotriazoles other than those listed above are also preferable. Examples of the benzotriazoles include benzotriazole (BTA), 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

In view of further improving anticorrosion performance, a compound represented by Formula (6) is particularly preferable as the anticorrosive.

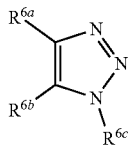

(6)

In Formula (6), $R^{6a}$, $R^{6b}$, and $R^{6c}$ each independently represent a hydrogen atom or a substituted or unsubstituted hydrocarbon group. Furthermore, $R^{6a}$ and $R^{6b}$ may be bonded to each other to form a ring.

Examples of the hydrocarbon group represented by $R^{6a}$ and $R^{6b}$ in Formula (6) include an alkyl group (preferably having 1 to 12 carbon atoms, more preferably having 1 to 6 carbon atoms, and even more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and even more preferably having 6 to 10 carbon atoms), and an aralkyl group (preferably having 7 to 23 carbon atoms, more preferably having 7 to 15 carbon atoms, and even more preferably having 7 to 11 carbon atoms).

The substituent is not particularly limited, and examples thereof include a hydroxyl group, a carboxyl group, and a substituted or unsubstituted amino group (the substituent is preferably an alkyl group having 1 to 6 carbon atoms and more preferably an alkyl group having 1 to 3 carbon atoms).

$R^{6a}$ and $R^{6b}$ may be bonded to each other to form a ring. Examples of the ring include a benzene ring and a naphthalene ring. In a case where $R^{6a}$ and $R^{6b}$ are bonded to each other to form a ring, the ring may further have a substituent (such as a hydrocarbon group having 1 to 5 carbon atoms or a carboxyl group).

Examples of the compound represented by Formula (6) include 1H-1,2,3-triazole, benzotriazole, and carboxybenzotriazole 5-methyl-1H-benzotriazole.

In a case where the chemical liquid contains an anticorrosive, the content of the anticorrosive with respect to the total mass of the chemical liquid is preferably 0.01% to 10% by mass, and more preferably 0.05% to 5% by mass.

<Chemical Liquid Manufacturing Method>

The method for manufacturing the chemical liquid is not particularly limited, and known manufacturing methods can be used. For example, a method of mixing together water, a hydroxylamine compound, and a predetermined amount of specific compound may be used. In mixing the above components, if necessary, other optional components may be mixed together.

Furthermore, in manufacturing the chemical liquid, if necessary, the chemical liquid may be purified by being filtered using a filter.

In view of further improving the effects of the present invention, the pH of the chemical liquid is preferably 1 to 13, and more preferably 2 to 12.

The chemical liquid according to the embodiment of the present invention is a chemical liquid used for an object to be treated containing a first metal-containing substance (material containing a metal selected from the group consisting of cobalt, ruthenium, molybdenum, aluminum, and copper).

The object to be treated for which the chemical liquid is to be used may contain at least one kind of first metal-containing substance. It is preferable that the object to be treated also contain another metal-containing substance (material containing a metal).

The aforementioned metal-containing substance is a material containing a metal, and may either or both of a first metal-containing substance other than the aforementioned "at least one kind of first metal-containing substance" and a second metal-containing substance which is a material different from the first metal-containing substance and contains a metal.

For example, it is preferable that the chemical liquid be used for an object to be treated which contains at least two kinds of first metal-containing substances or used for an object to be treated which contains the first metal-containing substance and the second metal-containing substance. In addition, the chemical liquid may be used for an object to be treated which contains at least two kinds of first metal-containing substances and the second metal-containing substance.

It is preferable that the chemical liquid be used for an object to be treated which is a treatment target containing at least two kinds of metal-containing substances in which the absolute value of a difference in a corrosion potential between the two kinds of metal-containing substances in the chemical liquid is 0.5 V or less (more preferably 0.3 V or less). It is preferable that at least one of the two kinds of metal-containing substances be the first metal-containing substance.

For example, in a case where the chemical liquid is used for an object to be treated which contains at least two kinds of first metal-containing substances, it is preferable that the absolute value of a difference in a corrosion potential between the two kinds of first metal-containing substances in the chemical liquid be 0.5 V or less (more preferably 0.3 V or less).

In a case where the object to be treated contains more than two kinds of first metal-containing substances, it is preferable that at least a combination (preferably all combinations) consisting of two kinds of first metal-containing substances in the object to be treated satisfy the range of the absolute value described above.

Furthermore, for example, In a case where the object to be treated contains the first metal-containing substance and the second metal-containing substance, it is preferable that the absolute value of a difference between a corrosion potential of the first metal-containing substance in the chemical liquid and a corrosion potential of the second metal-containing substance in the chemical liquid be 0.5 V or less (more preferably 0.3 V or less).

In a case where the object to be treated contains two or more kinds of first metal-containing substances and/or two or more kinds of second metal-containing substances, it is preferable that at least a combination (preferably all combinations) consisting of one kind of first metal-containing substance and one kind of second metal-containing substance in the object to be treated satisfy the range of the absolute value described above.

Details of the first metal-containing substance and the second metal-containing substance will be described later.

The corrosion potential is measured by the following method.

First, as measurement targets, a silicon wafer with a first metal-containing substance disposed on the wafer surface and a silicon wafer with a first metal-containing substance different from the above first metal-containing substance or a second metal-containing substance disposed on the wafer surface are prepared, and used as electrodes. Then, the prepared electrodes are immersed in a predetermined chemical liquid, the corrosion potential is measured based on the Tafel plot obtained using a potentiostat/galvanostat (Princeton Applied Research VersaSTAT 4), and the absolute value of a difference between corrosion potentials obtained from the two electrodes is determined. The corrosion potential corresponds to the potential of the inflection point of the curve of the Tafel plot.

The measurement conditions are as follows.
Current range: ±0.2 V (vs open circuit potential)
Scan rate: 1.0 mV/s (0.5 mV per session)
Counter electrode: Pt
Reference electrode: Ag/AgCl
Measurement temperature: 25° C.

<Chemical Liquid Storage Body>

The chemical liquid may be stored in a container and kept as it is until use.

The container and the chemical liquid stored in the container are collectively called chemical liquid storage body. The stored chemical liquid is used after being taken out of the chemical liquid storage body. Furthermore, the chemical liquid may be transported as a chemical liquid storage body.

It is preferable to use a container for semiconductors which has a high internal cleanliness and hardly causes elution of impurities. Examples of usable containers include a "CLEAN BOTTLE" series manufactured by AICELLO CORPORATION, and "PURE BOTTLE" manufactured by KODAMA PLASTICS Co., Ltd.

It is preferable that the inner wall of the container be formed of one or more kinds of resins selected from the group consisting of a polyethylene resin, a polypropylene resin, and a polyethylene-polypropylene resin, or formed of a resin different from these. It is also preferable that the inner wall of the container be formed of a metal having undergone a rustproofing treatment or a metal elution preventing treatment, such as stainless steel, Hastelloy, Inconel, or Monel.

As "resin different from these" described above, a fluororesin (perfluororesin) is preferable. In a case where a container having inner wall made of a fluororesin is used, the occurrence of problems such as elution of an ethylene or propylene oligomer can be further suppressed, than in a case where a container having inner wall formed of a polyethylene resin, a polypropylene resin, or a polyethylene-polypropylene resin is used.

Examples of the container having inner wall made of a fluororesin include a FluoroPure PFA composite drum manufactured by Entegris, and the like. In addition, it is also possible to use the containers described on page 4 of JP1991-502677A (JP-H03-502677A), page 3 of WO2004/016526A, pages 9 and 16 of the WO99/46309A, and the like.

Furthermore, in addition to the fluororesin described above, quartz and an electropolished metallic material (that is, a metallic material having undergone electropolishing) are also preferably used for the inner wall of the container.

For manufacturing the electropolished metallic material, it is preferable to use a metallic material which contains at least one kind of metal selected from the group consisting of chromium and nickel, and in which the total content of chromium and nickel is more than 25% by mass with respect to the total mass of the metallic material. Examples of such a metallic material include stainless steel and a nickel-chromium alloy.

The total content of chromium and nickel in the metallic material is preferably 30% by mass or more with respect to the total mass of the metallic material.

The upper limit of the total content of chromium and nickel in the metallic material is not particularly limited, but is preferably 90% by mass or less with respect to the total mass of the metallic material.

The stainless steel is not particularly limited, and known stainless steel can be used. Particularly, an alloy with a nickel content of 8% by mass or more is preferable, and austenite-based stainless steel with a nickel content of 8% by mass or more is more preferable.

Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

The nickel-chromium alloy is not particularly limited, and known nickel-chromium alloys can be used. Among these, a nickel-chromium alloy is preferable in which the nickel content is 40% to 75% by mass and the chromium content is 1% to 30% by mass.

Examples of the nickel-chromium alloy include HASTELLOY (trade name, the same is true of the following description), MONEL (trade name, the same is true of the following description), and INCONEL (trade name, the same is true of the following description). More specifically, examples thereof include HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass).

Furthermore, if necessary, the nickel-chromium alloy may further contain boron, silicon, tungsten, molybdenum, copper, or cobalt, in addition to the aforementioned alloy.

The method of electropolishing the metallic material is not particularly limited, and known methods can be used. For example, it is possible to use the methods described in paragraphs "0011" to "0014" in JP2015-227501A, paragraphs "0036" to "0042" in JP2008-264929A, and the like.

It is preferable that the metallic material have undergone buffing. As the buffing method, known methods can be used without particular limitation. The size of abrasive grains used for finishing the buffing is not particularly limited, but is preferably #400 or less because such grains make it easy to further reduce the surface asperity of the metallic material.

The buffing is preferably performed before the electropolishing.

Furthermore, one of the multistage buffing carried out by changing the size of abrasive grains, acid pickling, magnetorheological finishing, and the like or a combination of two or more treatments selected from the above may be performed on the metallic material.

It is preferable that the inside of these containers be washed before the containers are filled with the chemical liquid. For washing, it is preferable to use a liquid with a lower metal impurity content.

After being manufactured, the chemical liquid may be bottled using a container, such as a gallon bottle or a quart bottle, and transported or stored.

In order to prevent changes in the components of the chemical liquid during storage, the inside of the container may be purged with an inert gas (such as nitrogen or argon) having a purity of 99.99995% by volume or higher. Particularly, a gas with a low moisture content is preferable. Although the chemical liquid may be transported and stored at room temperature, in order to prevent deterioration, the temperature may be controlled in a range of −20° C. to 20° C.

The chemical liquid may be prepared as a kit composed of a plurality of separated raw materials of the chemical liquid.

Furthermore, the chemical liquid may be prepared as a concentrated solution. In a case where the chemical liquid is prepared as a concentrated solution, the concentration factor is appropriately determined depending on the composition, but is preferably 5× to 2,000×. That is, the concentrated solution is used after being diluted 5× to 2,000×.

[Method for Treating Object to be Treated]

In the method for treating an object to be treated according to an embodiment of the present invention (hereinafter, also simply described as "the present treatment method"), it is preferable to use the chemical liquid by bringing the chemical liquid into contact with the object to be treated containing the first metal-containing substance, so that the first metal-containing substance is dissolved (etched).

The chemical liquid effectively functions as a so-called etching treatment liquid.

The object to be treated may contain both the first metal-containing substance and second metal-containing substance (material which is different from the first metal-containing substance and contains a metal). In this case, the chemical liquid may be used for etching only the first metal-containing substance, or used for etching both the first metal-containing substance and second metal-containing substance.

The form of the object to be treated is not particularly limited. For example, the object may be an object 10 to be treated shown in FIG. 1 having a substrate 12, an insulating film 14 with hole portions that is disposed on the substrate 12, a second metal-containing substance portion 16 disposed in the form of a layer along the inner wall of the hole portions of the insulating film 14, and a first metal-containing substance portion 18 with which the hole portions are filled. In FIG. 1, the second metal-containing substance portion can function as a barrier metal layer.

Although FIG. 1 shows an aspect in which the object to be treated has one first metal-containing substance portion, the object to be treated is not limited to this aspect. For example, the object may be an object 20 to be treated shown in FIG. 2 having a substrate 12, an insulating film 14 with a plurality of hole portions that is disposed on the substrate 12, a second metal-containing substance portion 16 disposed in the form of a layer along the inner wall of each of the hole portions of the insulating film 14, and a first metal-containing substance portion 18 with which each of the hole portions is filled. That is, the object to be treated may have an aspect in which each of the first metal-containing substance and the second metal-containing substance is at a plurality of sites.

The type of substrate that may be contained in the object to be treated is not particularly limited. Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The size, thickness, shape, layer structure, and the like of the substrate are not particularly limited, and can be appropriately selected as desired.

As the insulating film, known insulating films are used.

Figure 2:
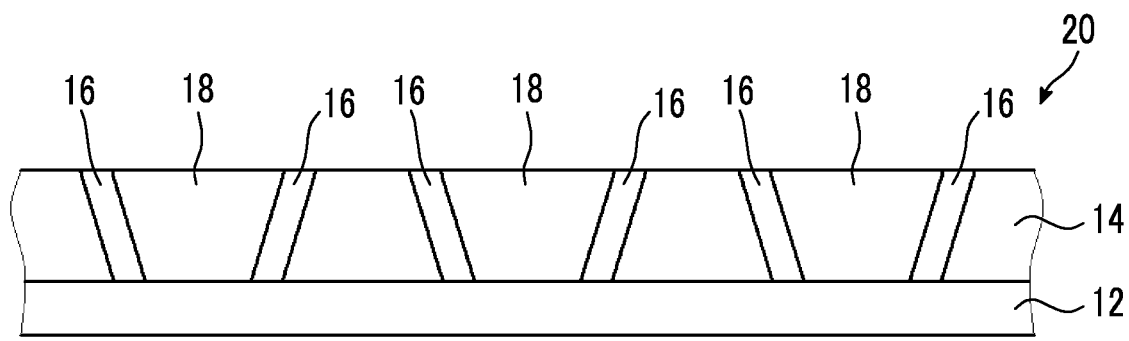
FIG. 2 is a cross-sectional view showing another embodiment of the object to be treated.

The insulating film in FIGS. 1 and 2 has hole portions. However, the insulating film is not limited to this aspect, and may be an insulating film having groove portions.

The first metal-containing substance may be a material that can be etched with the chemical liquid and contains metal atoms.

Particularly, the metal atoms contained in the first metal-containing substance are preferably one or more kinds of metals selected from the group consisting of cobalt, ruthenium, molybdenum, aluminum, and copper.

The first metal-containing substance is preferably one kind of simple metal listed above or an oxide or nitride of one kind of metal listed above.

Furthermore, the first metal-containing substance is preferably an alloy, a composite oxide, or a composite nitride of two or more kinds of metals listed above.

Among these, a cobalt-containing substance that contains cobalt atoms (for example, simple cobalt, a cobalt alloy, a cobalt oxide, or a cobalt nitride) is preferable as the first metal-containing substance.

The metal atoms contained in the second metal-containing substance are preferably one or more kinds of metals selected from the group consisting of cobalt, ruthenium, titanium, and tantalum.

The second metal-containing substance is preferably one kind of simple metal listed above or an oxide or nitride of one kind of metal listed above.

Furthermore, the second metal-containing substance is preferably an alloy, a composite oxide, or a composite nitride of two kinds of metals listed above.

Among these, a titanium-containing substance that contains titanium atoms (for example, simple titanium, a titanium oxide, or a titanium nitride) is preferable as the second metal-containing substance.

In a case where the object to be treated contains the second metal-containing substance, the first metal-containing substance and the second metal-containing substance may be in contact with each other in the object to be treated or may be arranged via other members.

The forms of the first metal-containing substance and the second metal-containing substance are not particularly limited. For example, the first and second metal-containing substances may be in the form of a film, wiring, or particles.

In a case where the first metal-containing substance and the second metal-containing substance are in the form of a film, the thickness thereof is not particularly limited and may be appropriately selected depending on the use. For example, the thickness is preferably 50 nm or less, more preferably 20 nm or less, and even more preferably 10 nm or less.

The first metal-containing substance and the second metal-containing substance may be disposed only on one of the main surfaces of the substrate, or may be disposed on both the main surfaces of the substrate. Furthermore, the first metal-containing substance and the second metal-containing substance may be disposed on the entire main surface of the substrate, or may be disposed on a portion of the main surface of the substrate.

As described above, the object to be treated may contain two or more kinds of first metal-containing substances, and may contain, in addition to the first metal-containing substance, the second metal-containing substance which is a material different from the first metal-containing substance and contains a metal.

In a case where the object to be treated contains two or more kinds of metal-containing substances, in an aspect, examples of combinations thereof include a combination of a cobalt-containing substance as a first metal-containing substance and a titanium-containing substance or tantalum-containing substance (for example, simple tantalum, a tantalum oxide, or a tantalum nitride) as a second metal-containing substance.

The object to be treated may include various layers and/or structures as desired, in addition to the first metal-containing substance and the second metal-containing substance. For example, the substrate may have metal wiring, a gate electrode, a source electrode, a drain electrode, an insulating layer, a ferromagnetic layer, and/or a non-magnetic layer, and the like.

The substrate may include the structure of an exposed integrated circuit, for example, an interconnection mechanism such as metal wiring and a dielectric material. Examples of metals and alloys used for the interconnection mechanism include aluminum, a copper-aluminum alloy, copper, titanium, tantalum, cobalt, silicon, titanium nitride, tantalum nitride, and tungsten. The substrate may include a layer of silicon oxide, silicon nitride, silicon carbide, and/or carbon-doped silicon oxide.

The method for manufacturing the object to be treated is not particularly limited. For example, the object to be treated shown in FIG. 1 may be manufactured by a method of forming an insulating film on a substrate, forming hole portions or groove portions in the insulating film, arranging a metal-containing substance layer and a cobalt-containing substance layer in this order on the insulating film by a sputtering method, a chemical vapor deposition (CVD) method, a molecular beam epitaxy (MBE) method, or the like, and then performing a smoothing treatment such as CMP.

<First Aspect>

Examples of the method for treating an object to be treated according to an embodiment of the present invention include a method having a step A of bringing the object to be treated containing at least the first metal-containing substance into contact with the chemical liquid so that the first metal-containing substance is dissolved.

This method for treating an object to be treated is also called a first aspect of the method for treating an object to be treated according to the embodiment of the present invention.

The method of bringing the object to be treated into contact with the chemical liquid is not particularly limited, and examples thereof include a method of immersing the object to be treated in the chemical liquid stored in a tank, a method of spraying the chemical liquid onto the object to be treated, a method of causing the chemical liquid to flow on the object to be treated, and a combined method consisting of any of the above methods. Among these, the method of immersing the object to be treated in the chemical liquid is preferable.

In order to further enhance the washing ability of the chemical liquid, a mechanical stirring method may also be used.

Examples of the mechanical stirring method include a method of circulating the chemical liquid on an object to be treated, a method of causing the chemical liquid to flow on the object to be treated or spraying the chemical liquid onto the object to be treated, and a method of stirring the chemical liquid by using ultrasonic or megasonic waves.

The contact time between the object to be treated and the chemical liquid can be adjusted as appropriate.

The treatment time (the contact time between the chemical liquid and the object to be treated) is not particularly limited, but is preferably 0.25 to 10 minutes, and more preferably 0.5 to 2 minutes.

The temperature of the chemical liquid during the treatment is not particularly limited, but is preferably 20° C. to 75° C. and more preferably 20° C. to 60° C.

By the treatment performed as above, mainly the first metal-containing substance in the object to be treated is dissolved.

In a case where the object to be treated contains the second metal-containing substance in addition to the first metal-containing substance, the second metal-containing substance may or may not be dissolved together with the first metal-containing substance by this treatment. In a case where the second metal-containing substance is dissolved, the dissolution of the second metal-containing substance may be intentional or inevitable.

In a case where the dissolution of the second metal-containing substance is unintentional, it is preferable that the amount of the inevitably dissolved second metal-containing substance be small. In a case where the dissolution of the second metal-containing substance is unintentional, and the amount of the inevitably dissolved second metal-containing substance is small, the chemical liquid is also described as being excellent in member resistance of the second metal-containing substance.

For example, the chemical liquid according to the embodiment of the present invention is excellent in member resistance of a tantalum nitride.

<Second Aspect>

Furthermore, for example, in another aspect, the method for treating an object to be treated according to an embodiment of the present invention has a step A of bringing the object to be treated containing the first metal-containing substance and the second metal-containing substance into contact with the chemical liquid so that the first metal-containing substance is dissolved, and a step B of bringing the object to be treated into contact with a solution selected from the group consisting of a mixed aqueous solution of ammonia and aqueous hydrogen peroxide, a mixed aqueous solution of hydrofluoric acid and aqueous hydrogen peroxide, a mixed aqueous solution of sulfuric acid and aqueous hydrogen peroxide, and a mixed aqueous solution of hydrochloric acid and aqueous hydrogen peroxide (hereinafter, the solution will be also simply called "specific solution") before or after the step A so that the second metal-containing substance is dissolved.

This method for treating an object to be treated is also called a second aspect of the method for treating an object to be treated according to the embodiment of the present invention.

The second aspect can also be said to be a form of the first aspect.

In the step A, the second metal-containing substance may be intentionally or inevitably dissolved. Furthermore, in the step B, the first metal-containing substance may be intentionally or inevitably dissolved.

The procedure of the step A is as described above.

In some cases, the second metal-containing substance in the object to be treated may have different solubility in the aforementioned chemical liquid, depending on the type of metal atoms that the chemical liquid contains. In these cases, it is preferable to adjust the extent of dissolution of the first metal-containing substance and the second metal-containing substance by using a solution that excellently dissolves the second metal-containing substance.

Such an adjustment procedure corresponds to the step B of bringing the object to be treated, which has been or has not yet been subjected to the step A, into contact with the specific solution so that the second metal-containing substance is dissolved.

The specific solution is a solution selected from the group consisting of a mixed aqueous solution of ammonia and aqueous hydrogen peroxide (APM), a mixed aqueous solution of hydrofluoric acid and aqueous hydrogen peroxide (FPM), a mixed aqueous solution of sulfuric acid and aqueous hydrogen peroxide (SPM), and a mixed aqueous solution of hydrochloric acid and hydrogen peroxide (HPM).

The composition of APM is, for example, preferably in a range of "aqueous ammonia:aqueous hydrogen peroxide:water=1:1:1" to "aqueous ammonia:aqueous hydrogen peroxide:water=1:3:45" (volume ratio).

The composition of FPM is, for example, preferably in a range of "hydrofluoric acid:aqueous hydrogen peroxide:water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3:1:0" to "sulfuric acid:aqueous hydrogen peroxide:water=1:1:10" (volume ratio).

The composition of HPM is, for example, preferably in a range of "hydrochloric acid:aqueous hydrogen peroxide:water=1:1:1" to "hydrochloric acid:aqueous hydrogen peroxide:water=1:1:30" (volume ratio).

The preferred compositional ratio described above means a compositional ratio determined in a case where the content of aqueous ammonia is 28% by mass, the content of hydrofluoric acid is 49% by mass, the content of sulfuric acid is 98% by mass, the content of hydrochloric acid is 37% by mass, and the content of aqueous hydrogen peroxide is 30% by mass.

Furthermore, the volume ratio is based on a volume at room temperature.

"A:B:C=x:y:z to A:B:C=X:Y:Z" used above to describe a preferable range means that it is preferable that at least one (preferably two and more preferably all) of "A:B=x:y to A:B=X:Y", "B:C=y:z to B:C=Y:Z", or "A:C=x:z to A:C=X:Z" be satisfied.

In the step B, the method of bringing the object to be treated, which has been or has not yet been subjected to the step A, into contact with the specific solution by using the specific solution is not particularly limited. Examples of the method include a method of immersing the object to be treated in the specific solution stored in a tank, a method of spraying the specific solution onto the object to be treated, a method of causing the specific solution to flow on the object to be treated, and a combined method consisting of any of the above methods.

The contact time between the object to be treated, which has been or has not yet been subjected to the step A, and the specific solution is, for example, preferably 0.25 to 10 minutes, and more preferably 0.5 to 5 minutes.

The step A and the step B may be performed alternately.

In a case where the steps are performed alternately, it is preferable that each of the step A and the step B be performed 1 to 20 times.

<Third Aspect>

In another aspect of the method for treating an object to be treated according to an embodiment of the present invention, for example, the chemical liquid is used and applied to a substrate having undergone dry etching so that the first metal-containing substance is dissolved and dry etching residues on the substrate are removed.

More specifically, this is a method of bringing the chemical liquid into contact with an object to be treated which contains the first metal-containing substance and dry etching residues on the surface thereof (and the second metal-containing substance as desired) so that the first metal-containing substance is dissolved and the dry etching residues on the surface of the object to be treated are removed.

This method for treating an object to be treated is also called a third aspect of the method for treating an object to be treated according to the embodiment of the present invention. The third aspect can be said to be a form of the first aspect described above that is accomplished by specifically restricting the constitution of the object to be treated and the purpose of the treatment in the first aspect.

The chemical liquid according to the embodiment of the present invention can also be suitably used for washing the object to be treated (for removing residues) as described above.

Figure 3:
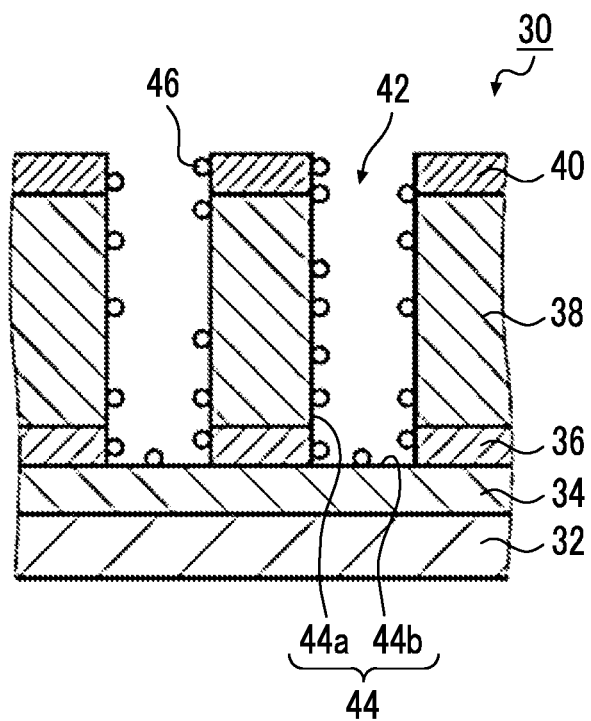
FIG. 3 is a schematic cross-sectional view showing an example of a laminate applicable to a method for treating an object to be treated according to an embodiment of the present invention.

FIG. 3 is a schematic view showing an example of the object to be treated in the third aspect.

An object 30 to be treated shown in FIG. 3 comprises a metal-containing film 34, an etch stop layer 36, an interlayer insulating film 38, a metal hard mask 40 in this order on a substrate 32. Through a dry etching step or the like, a hole 42 exposing the metal-containing film 34 is formed at a predetermined position. That is, the object to be treated shown in FIG. 3 is a laminate which comprises the substrate 32, the metal-containing film 34, the etch stop layer 36, the interlayer insulating film 38, and the metal hard mask 40 in this order and comprises the hole 42 that extends from the surface of the metal hard mask 40 to the surface of the metal-containing film 34 at the position of the opening portion of the mask 40. An inner wall 44 of the hole 42 is constituted with a cross-sectional wall 44a which includes the etch stop layer 36, the interlayer insulating film 38, and the metal hard mask 40, and a bottom wall 44b which includes the exposed metal-containing film 34. A dry etching residue 46 is attached to the inner wall 44.

The metal hard mask in the object to be treated may turn into a barrier metal after the object to be treated is further processed. In other words, the layer that will turn into a barrier metal in the subsequent step may be used as a metal hard mask in the dry etching step. That is, the barrier metal may be used as a metal hard mask.

For example, it is preferable that at least one of the metal-containing film 34 or the metal hard mask 40 be the first metal-containing substance. Especially, it is preferable that the metal-containing film 34 and the metal hard mask 40 be the first metal-containing substance and the second metal-containing substance respectively, or that the metal-containing film 34 and the metal hard mask 40 be the second metal-containing substance and the first metal-containing substance respectively.

It is particularly preferable that the metal-containing film 34 and the metal hard mask 40 be the first metal-containing substance and the second metal-containing substance respectively.

As the interlayer insulating film, known materials can be used.

The dry etching residues may contain the first metal-containing substance.

Examples of the specific method of the third aspect include a method of bringing the aforementioned object to be treated into contact with the chemical liquid.

The method of bringing the object to be treated into contact with the chemical liquid is as described above in the first aspect.

By the method of bringing the chemical liquid into contact with the object to be treated, usually, the dry etching residues on the object to be treated are removed, and the first metal-containing substance (preferably the metal-containing film 34) is dissolved. The dissolving amount of the first metal-containing substance is not limited. The dissolution of the first metal-containing substance may be intentional dissolution for removing a part or all of the metal-containing film 34 (first metal-containing substance) on the bottom wall 44b of the hole 42, or inevitable dissolution resulting from the contact between the chemical liquid and the first metal-containing substance.

If necessary, the present treatment method may include a rinsing step of performing a rinsing treatment on the object to be treated by using a rinsing solution.

For example, the method for treating an object to be treated in the first aspect, the second aspect, or the third aspect described above may further include the rinsing step after the procedure described above in each aspect.

As the rinsing solution, for example, water, hydrofluoric acid (preferably 0.001% to 1% by mass hydrofluoric acid), hydrochloric acid (preferably 0.001% to 1% by mass hydrochloric acid), aqueous hydrogen peroxide (preferably 0.5% to 31% by mass aqueous hydrogen peroxide, and more preferably 3% to 15% by mass aqueous hydrogen peroxide), a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), a mixed solution of hydrochloric acid and aqueous hydrogen peroxide (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia (preferably aqua regia obtained by mixing together "37% by mass hydrochloric acid:60% by mass nitric acid" at a volume ratio of "2.6:1.4" to "3.4:0.6"), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), acetic acid (preferably a 0.01% to 10% by mass aqueous acetic acid solution or an undiluted acetic acid solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the preferred conditions required, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The aqueous ozone, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing solutions may be used by being mixed together.

The rinsing solution may also contain an organic solvent.

Examples of the specific method of the rinsing step include a method of bringing the rinsing solution into contact with the object to be treated.

The method of bringing the rinsing solution into contact with the object to be treated is performed by a method of immersing the object to be treated in the rinsing solution stored in a tank, a method of spraying the rinsing solution onto the object to be treated, a method of causing the rinsing solution to flow on the object to be treated, or a combined method consisting of any of the above methods.

The treatment time (contact time between the rinsing solution and the object to be treated) is not particularly limited, but is 5 seconds to 5 minutes for example.

The temperature of the rinsing solution during the treatment is not particularly limited. Generally, the temperature of the rinsing solution is, for example, preferably 16° C. to 60° C., and more preferably 18° C. to 40° C. In a case where SPM is used as the rinsing solution, the temperature thereof is preferably 90° C. to 250° C.

If necessary, the present treatment method may include a drying step of performing a drying treatment after the rinsing step. The method of the drying treatment is not particularly limited, and examples thereof include spin drying, causing a drying gas to flow on the substrate, heating the substrate by a heating unit such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The present treatment method may be performed in combination with a semiconductor device manufacturing method, before or after the steps performed in the manufacturing method. While being performed, the present treatment method may be incorporated into those other steps. Alternatively, while those other steps are being performed, the present treatment method may be incorporated into the steps and performed.

Examples of those other steps include a step of forming each structure such as metal wiring, a gate structure, a source structure, a drain structure, an insulating layer, a ferromagnetic layer and/or a non-magnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line).

In addition, the chemical liquid may be applied, for example, to NAND, dynamic random access memory (DRAM), static random access memory (SRAM), resistive random access memory (ReRAM), ferroelectric random access memory (FRAM (registered trademark)), magnetoresistive random access memory (MRAM), phase change random access memory (PRAM), or the like, or applied to a logic circuit, a processor, or the like.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not limited to the following examples.

[Preparation of Chemical Liquid]

The compounds listed in the following table (such as a hydroxylamine compound, a chelating agent, a specific compound, a pH adjuster, and water) were mixed together according to a predetermined formulation, thereby preparing chemical liquids used in each test.

In a case where a pH adjuster was used, the amount of the pH adjuster added was adjusted so that the chemical liquid had a pH shown in the table.

The balance of the chemical liquid other than the components shown in the table is water. In other words, the component other than the hydroxylamine compound, the chelating agent, the specific compound, and the pH adjuster is water.

As each raw material, a semiconductor grade high-purity raw material was used. If necessary, a purification treatment was additionally performed on the raw material.

Here, as the specific compound, a synthetic product was used, which was added to the chemical liquid after being subjected to the purification treatment. In addition, the specific compound that can include both the cis isomer and trans isomer was synthesized as it was as a mixture of the cis isomer and the trans isomer, and added as it was to the chemical liquid.

<Specific Compound>

The specific compounds used for preparing the chemical liquids are as below.

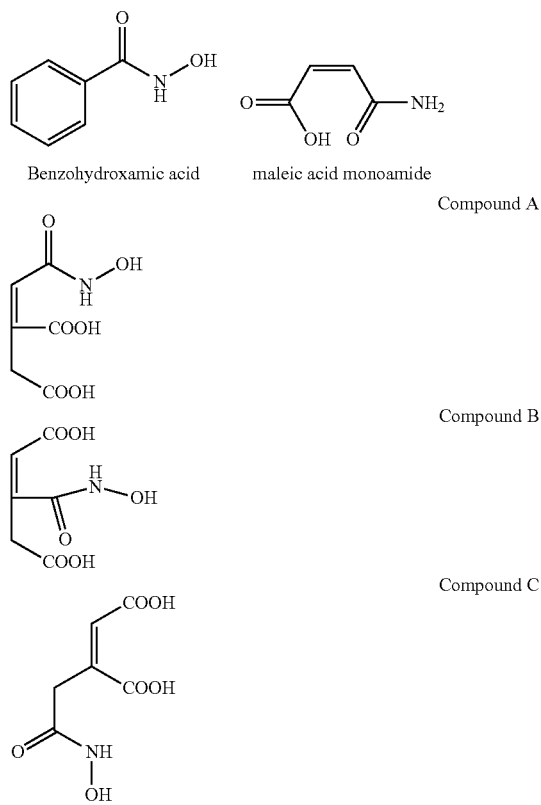

[Test X (Test Using Cobalt-Containing Substance as First Metal-Containing Substance)]

<Dissolvability Evaluation>

An object A to be treated having the structure shown in FIG. 1 was prepared. Specifically, the object A to be treated used in this evaluation includes a substrate, an insulating film with hole portions disposed on the substrate, a titanium nitride layer (corresponding to a second metal-containing substance) disposed in the form of layer along the lateral surface of the hole portions, and metallic cobalt (corresponding to a cobalt-containing substance as a first metal-containing substance) with which the hole portions are filled.

The obtained object A to be treated was immersed in SC-1 (28% ammonia:30% hydrogen peroxide:water=1:2:30 (mass ratio)) at 30° C. for 1 minute. Then, the object A to be treated went through treatment cycles each consisting of immersion in each chemical liquid listed in the table for 30 seconds at room temperature. The number of cycles repeated until the metallic cobalt dissolved by 20 nm was counted, and dissolvability was evaluated according to the following standard. The smaller the number of cycles, the higher the dissolvability of the chemical liquid.

"A": The number of cycles is 1 to 5.
"B": The number of cycles is 6 to 10.
"C": The number of cycles is 11 to 15.
"D": The number of cycles is 16 to 20.
"E": The number of cycles is 21 or more.

(Variation Evaluation)

An object B to be treated having the structure shown in FIG. 2 was prepared. Specifically, the object B to be treated used in this evaluation includes a substrate, an insulating film with a plurality of (100 or more) hole portions disposed on the substrate, a titanium nitride layer (corresponding to a second metal-containing substance) disposed in the form of layer along the lateral surface of the hole portions, and metallic cobalt (corresponding to a cobalt-containing substance as a first metal-containing substance) with which the hole portions are filled.

The obtained object B to be treated was immersed in SC-1 (28% ammonia:30% hydrogen peroxide:water=1:2:30 (mass ratio)) at 30° C. for 1 minute. Then, the object B to be treated went through treatment cycles each consisting of immersion in each chemical liquid listed in Table 1 for 30 seconds at room temperature. The number of treatment cycles in which the object B to be treated was immersed in each chemical liquid was the same as the number of cycles repeated until metallic cobalt in the object A to be treated was dissolved by 20 nm in <Dissolvability evaluation> described above.

Fifty cross sections of the hole portions, which were filled with the metallic cobalt in the obtained object B to be treated, were observed with a scanning microscope (Hitachi High-Tech Corporation., S-4800). The variation (standard deviation) in the film thickness of the residual metallic cobalt portion in each region was calculated and evaluated according to the following standard.

"A": 1 nm or less
"B": More than 1 nm and 3 nm or less
"C": More than 3 nm and 5 nm or less
"D": More than 5 nm and 10 nm or less
"E": More than 10 nm <Smoothness (Roughness) Evaluation>

Substrates were prepared in which a metallic cobalt layer was formed on one surface of a commercial silicon wafer (diameter: 12 inches) by a chemical vapor deposition (CVD) method. The thickness of the metallic cobalt layer was 15 nm.

Each of the obtained substrates was put in a container filled with each chemical liquid, and the chemical liquid was stirred. The removal treatment was interrupted after a short time passed, that is, at a point in time when ½ of the time taken for the metallic cobalt layer to disappear passed after the start of stirring or at a point in time when 30 minutes passed after the start of stirring. Then, after the treatment, the surface of the metallic cobalt layer was observed with a scanning electron microscope, and the smoothness of the treated portion was evaluated according to the following standard.

A: The surface of the metallic cobalt layer is smooth, and no roughness is observed.

B: The surface of the metallic cobalt layer is smooth, and substantially no roughness is observed (roughness higher than A).

C: Although the surface of the metallic cobalt layer is slightly rough, the roughness is at an acceptable level (roughness higher than B).

D: Although the surface of the metallic cobalt layer is rough, the roughness is at an acceptable level (roughness higher than C).

E: The surface of the metallic cobalt layer is rough, and the roughness is at an unacceptable level.

<Measurement of Corrosion Potential Difference>

A silicon wafer with metallic cobalt disposed on a wafer surface or a silicon wafer with titanium nitride (TiN) disposed on a wafer surface was used as an electrode for measurement. The electrodes were immersed in each chemical liquid listed in the table, the corrosion potentials thereof were measured based on the Tafel plot obtained using potentiostat/galvanostat (Princeton Applied Research VersaSTAT 4), and the absolute value of a difference between the corrosion potentials was determined. The corrosion potential corresponds to the potential of the inflection point of the curve of the Tafel plot.

The measurement conditions are as follows.
Current range: ±10.2 V (vs open circuit potential)
Scan rate: 1.0 mV/s (0.5 mV per session)
Counter electrode: Pt
Reference electrode: Ag/AgCl
Measurement temperature: 25° C.

<Result of Test X>

Table 1 shows the formulation of the chemical liquids used in the series of test X and the test results.

In Table 1, each of "Content (% by mass)" in the column of "Hydroxylamine compound", "Content (% by mass)" in the column of "Specific compound", and "Content (% by mass)" in the column of "Chelating agent" means the content (% by mass) of each compound with respect to the total mass of the chemical liquid.

The column of "Ratio 1" shows the mass ratio of the content of the hydroxylamine compound to the content of the specific compound.

The column of "Ratio 2" shows the mass ratio of the content of the chelating agent to the content of the specific compound.

The column of "Ratio 3" is for a chemical liquid using two or more kinds of specific compounds, which shows the mass ratio of the content of a specific compound which takes up the highest proportion of the specific compounds to the content of a specific compound which takes up the second highest proportion of the specific compounds. In the chemical liquid of Example 7, the content of a specific compound which takes up the highest proportion of the specific compounds is substantially the same as the content of a specific compound which takes up the second highest proportion of the specific compounds. Therefore, the ratio 3 is "1" in Example 7.

"E+number" in each cell represents "$\times 10^{number}$".

TABLE 1

| Table 1 | | Composition of chemical liquid | | | | | | | | | | | Evaluation result | | | |
|---|---|---|---|---|---|---|---|---|---|---|---|---|---|---|---|---|
| | | Hydroxylamine compound | | Specific compound | | | | Chelating agent | | pH adjuster | pH | Ratio 1 (HA/ Specific compound) | Ratio 2 (Chelating agent/ Specific compound) | Ratio 3 (Specific compound/ Specific compound) | Dissolv- ability | Roughness | Variation | Corrosion potential difference (V) |
| | | Type | Content (% by mass) | Type | Content (% by mass) | Type | Content (% by mass) | Type | Content (% by mass) | | | | | | | | | |
| Example | 1 | Hydroxylamine | 0.5 | Benzohydroxamic acid | 0.03 | | | | | | 8 | 1.7E+01 | | | C | B | C | Less than 0.1 |
| | 2 | Hydroxylamine | 0.5 | Maleic acid monoamide | 0.03 | | | | | | 8 | 1.7E+01 | | | C | C | C | Less than 0.1 |
| | 3 | Hydroxylamine | 0.5 | Compound A | 0.03 | | | | | | 8 | 1.7E+01 | | | C | B | B | Less than 0.1 |
| | 4 | Hydroxylamine | 0.5 | Compound B | 0.03 | | | | | | 8 | 1.7E+01 | | | C | B | B | Less than 0.1 |
| | 5 | Hydroxylamine | 0.5 | Compound C | 0.03 | | | | | | 8 | 1.7E+01 | | | C | B | B | Less than 0.1 |
| | 6 | Hydroxylamine | 0.5 | Compound A | 0.0299 | Compound C | 0.0001 | | | | 8 | 1.7E+01 | | 3.0E+02 | B | B | B | Less than 0.1 |
| | 7 | Hydroxylamine | 0.5 | Compound A | 0.03 | Compound C | 0.03 | | | | 8 | 8.3E+00 | | 1.0E+00 | B | A | B | Less than 0.1 |
| | 8 | Hydroxylamine | 0.5 | Compound A | 0.029 | Compound C | 0.001 | | | | 8 | 1.7E+01 | | 2.9E+01 | B | A | B | Less than 0.1 |
| | 9 | Hydroxylamine | 0.5 | Compound A | 0.001 | Compound C | 0.029 | | | | 8 | 1.7E+01 | | 2.9E+01 | B | A | B | Less than 0.1 |
| | 10 | Hydroxylamine | 0.5 | Compound A | 0.0001 | Compound C | 0.0299 | | | | 8 | 1.7E+01 | | 3.0E+02 | B | B | B | Less than 0.1 |
| | 11 | Hydroxylamine | 0.5 | Compound A | 0.00001 | | | | | | 10 | 5.0E+04 | | | C | C | B | 0.1 |
| | 12 | Hydroxylamine | 0.5 | Compound A | 0.0001 | | | | | | 10 | 5.0E+03 | | | C | C | B | Less than 0.1 |
| | 13 | Hydroxylamine | 0.5 | Compound A | 0.002 | | | | | | 8 | 2.5E+02 | | | C | C | B | Less than 0.1 |
| | 14 | Hydroxylamine | 0.5 | Compound A | 0.1 | | | | | | 5 | 5.0E+00 | | | C | B | B | Less than 0.1 |
| | 15 | Hydroxylamine | 0.5 | Compound A | 1 | | | | | | 4 | 5.0E-01 | | | C | B | B | Less than 0.1 |
| | 16 | Hydroxylamine | 0.5 | Compound A | 9.9 | | | | | | 3 | 5.1E-02 | | | C | B | C | Less than 0.1 |
| | 17 | Hydroxylamine | 0.05 | Compound A | 9.9 | | | | | | 2.5 | 5.1E-03 | | | D | C | C | Less than 0.1 |
| | 18 | Hydroxylamine | 0.002 | Compound A | 9.9 | | | | | | 2.5 | 2.0E-04 | | | D | C | C | 0.2 |
| | 19 | Hydroxylamine | 0.5 | Compound A | 0.03 | | | Citric acid | 0.05 | | 9 | 1.7E+01 | 1.7E+00 | | C | B | B | 0.1 |
| | 20 | Hydroxylamine | 0.5 | Compound A | 0.03 | | | Citric acid | 0.2 | | 7 | 1.7E+01 | 6.7E+00 | | A | B | A | Less than 0.1 |
| | 21 | Hydroxylamine | 0.5 | Compound A | 0.03 | Compound B | 0.01 | Citric acid | 0.3 | | 6 | 1.3E+01 | 7.5E+00 | 3.0E+00 | A | A | A | Less than 0.1 |
| | 22 | Hydroxylamine | 0.5 | Compound A | 0.03 | | | Citric acid | 2 | | 3 | 1.7E+01 | 6.7E+01 | | A | B | A | Less than 0.1 |
| | 23 | Hydroxylamine | 0.5 | Compound A | 0.03 | | | Citric acid | 15 | | 2 | 1.7E+01 | 5.0E+02 | | A | B | B | Less than 0.1 |
| | 24 | Hydroxylamine | 2 | Compound A | 0.03 | | | Citric acid | 0.5 | | 8 | 6.7E+01 | 1.7E+01 | | A | A | A | Less than 0.1 |
| | 25 | Hydroxylamine | 5 | Compound A | 0.03 | | | Citric acid | 0.5 | | 10 | 1.7E+02 | 1.7E+01 | | A | A | A | Less than 0.1 |

TABLE 2

| | | Composition of chemical liquid | | | | | | | | | | | Evaluation result | | | |
|---|---|---|---|---|---|---|---|---|---|---|---|---|---|---|---|---|
| | | Hydroxylamine Compound | | Specific compound | | Chelating agent | | | | Ratio 1 | Ratio 2 | Ratio 3 | | | | Corrosion |
| Table 1 | | Type | Content (% by mass) | Type | Content (% by mass) | Type | Content (% by mass) | pH adjuster | pH | (HA/Specific compound) | (Chelating agent/Specific compound) | (Specific compound/Specific compound) | Dissolvability | Roughness | Variation | potential difference (V) |
| Example | 26 | Hydroxylamine | 15 | Compound A | 0.03 | Citric acid | 0.5 | | 11 | 5.0E+02 | | | A | A | A | Less than 0.1 |
| | 27 | Hydroxylamine | 15 | Compound A | 0.0001 | Citric acid | 0.5 | | 11 | 1.5E+05 | 5.0E+03 | | A | C | B | 0.2 |
| | 28 | Hydroxylamine | 0.5 | Compound A | 0.03 | Nitrilotrismethylene-phosphonic acid | 0.2 | | 7 | 1.7E+01 | 6.7E+00 | | B | B | A | 0.1 |
| | 29 | Hydroxylamine | 0.5 | Compound A | 0.03 | 1-Hydroxyethylidene-1,1-diphosphonic acid | 0.2 | | 7 | 1.7E+01 | 6.7E+00 | | B | B | A | 0.2 |
| | 30 | Hydroxylamine | 0.5 | Compound A | 0.03 | Methanesulfonic acid | 0.2 | | 7 | 1.7E+01 | 6.7E+00 | | B | B | A | 0.2 |
| | 31 | Hydroxylamine | 0.5 | Compound A | 0.03 | Succinic acid | 0.2 | | 7 | 1.7E+01 | 6.7E+00 | | B | B | A | 0.1 |
| | 32 | Hydroxylamine | 0.5 | Compound A | 0.03 | Oxalic acid | 0.2 | | 7 | 1.7E+01 | 6.7E+00 | | B | B | A | 0.1 |
| | 33 | Hydroxylamine | 0.5 | Compound A | 0.03 | Trans-1,2-diaminocyclohexanetetraacetic acid | 0.2 | | 7 | 1.7E+01 | 6.7E+00 | | B | B | A | 0.1 |
| | 34 | Hydroxylamine | 0.5 | Compound A | 0.03 | Ethylenediaminetetraacetic acid | 0.2 | | 7 | 1.7E+01 | 6.7E+00 | | B | B | A | 0.1 |
| | 35 | Hydroxylamine | 0.5 | Compound A | 0.03 | Diethylenetriaminepentaacetic acid | 0.2 | | 7 | 1.7E+01 | 6.7E+00 | | B | B | A | 0.1 |
| | 36 | Hydroxylamine | 0.5 | Compound A | 0.03 | Citric acid | 0.2 | Sulfuric acid | 5 | 1.7E+01 | 6.7E+00 | | B | B | B | 0.2 |
| | 37 | Hydroxylamine | 0.5 | Compound A | 0.03 | Citric acid | 0.2 | Nitric acid | 5 | 1.7E+01 | 6.7E+00 | | A | B | B | 0.3 |
| | 38 | Hydroxylamine | 0.5 | Compound A | 0.03 | Citric acid | 0.2 | Periodic acid | 5 | 1.7E+01 | 6.7E+00 | | A | B | B | 0.3 |
| | 39 | Hydroxylamine | 0.5 | Compound A | 0.03 | Citric acid | 0.2 | Tetramethylammonium hydroxide | 8 | 1.7E+01 | 6.7E+00 | | B | B | A | 0.1 |
| | 40 | Hydroxylamine | 0.5 | Compound A | 0.03 | Citric acid | 0.2 | Aqueous ammonia | 10 | 1.7E+01 | 6.7E+00 | | B | B | A | 0.1 |
| | 41 | Hydroxylamine sulfate | 0.5 | Compound A | 0.03 | | | Tetramethylammonium hydroxide | 7 | 1.7E+01 | | | B | B | A | 0.1 |
| | 42 | Hydroxylamine hydrochloride | 0.5 | Compound A | 0.03 | | | Tetramethylammonium hydroxide | 7 | 1.7E+01 | | | B | B | A | 0.1 |
| | 43 | Hydroxylamine phosphate | 0.5 | Compound A | 0.03 | | | Tetramethylammonium hydroxide | 7 | 1.7E+01 | | | B | B | A | 0.1 |
| | 44 | Hydroxylamine nitrate | 0.5 | Compound A | 0.03 | | | Tetramethylammonium hydroxide | 7 | 1.7E+01 | | | B | B | A | 0.1 |
| | 45 | N,N'-diethylhydroxylamine | 0.5 | Compound A | 0.03 | | | Sulfuric acid | 7 | 1.7E+01 | | | B | B | A | 0.3 |
| Comparative Example | 1 | Hydroxylamine | 0.5 | | | | | | 11 | | | | E | E | E | 0.5 |
| | 2 | Hydroxylamine | 0.5 | Compound A | 0.03 | | | | 3 | | | | D | C | E | 0.2 |

From the results shown in the table, it has been confirmed that the chemical liquid according to an embodiment of the present invention can reduce the variation in the dissolving amount in a case where the chemical liquid dissolves the cobalt-containing substance as the first metal-containing substance.

It has been confirmed that in a case where the specific compound contains a group containing —CO—NH—OH as a specific substituent, the effects of the present invention are further improved.

Furthermore, it has been confirmed that in a case where one of $R^1$ to $R^3$ in the specific compound is a specific substituent and the other two are groups represented by Formula (2), the effects of the present invention are further improved.

(See the Results of Examples 1 to 5 and the Like.)

It has been confirmed that in a case where the content of the specific compound is 0.01% to 1% by mass with respect to the total mass of the chemical liquid, the effects of the present invention are further improved.

(See the Results of Examples 16 to 18 and 24 to 26, and the Like.)

It has been confirmed that in a case where the content of the hydroxylamine compound is 0.1% to 18% by mass with respect to the total mass of the chemical liquid, the effects of the present invention are further improved.

(See the Results of Examples 3 and 11 to 16, and the Like.)

It has been confirmed that in a case where the content of the chelating agent is 0.1% to 15% by mass (more preferably 0.1% to 5% by mass, and even more preferably more than 0.2% by mass and 1% by mass or less) with respect to the total mass of the chemical liquid, the effects of the present invention are further improved.

(See the Results of Examples 19 to 23 and 26, and the Like.)

It has been confirmed that in a case where the chemical liquid contains a chelating agent (preferably citric acid), the effects of the present invention are further improved.

(See the Results of Examples 3, 20, and 28 to 35, and the Like.)

It has been confirmed that in a case where the mass ratio of the content of the chelating agent to the content of the specific compound (content of chelating agent/content of specific compound) is $7.0 \times 10^0$ to $5.0 \times 10^1$ in the chemical liquid, the effects of the present invention are further improved.

(See the Results of Examples 21 and 24 to 26, and the Like.)

It has been confirmed that in a case where the chemical liquid contains two or more kinds of specific compounds, and the mass ratio of the content of a specific compound which takes up the highest proportion of the specific compounds to the content of a specific compound which takes up the second highest proportion of the specific compounds is 500 or less (more preferably 50 or less), the effects of the present invention are further improved.

(See the Results of Examples 6 to 10 and the Like.)

[Test Y (Test Using Substances Other than Cobalt-Containing Substance as First Metal-Containing Substance)]

The dissolvability evaluation, variation evaluation, smoothness (roughness) evaluation, and measurement of a corrosion potential difference were performed in the same manner as in the test X described above, except that cobalt (metallic cobalt) was changed to ruthenium (Ru), molybdenum (Mo), aluminum (Al), or copper (Cu).

The results of the test Y are shown in Table 2.

Each of the example numbers in Table 2 shows that the same chemical liquid as that in the corresponding examples in Table 1 in the test X was used.

For example, in Example 3 in the test Y, the same chemical liquid as that used in Example 3 in Test X was used for the test.

TABLE 3

| Table 2 | | Dissolvability | Roughness | Variation | Corrosion potential difference (V) |
|---|---|---|---|---|---|
| Ru Evaluation result | | | | | |
| Example | 3 | C | B | B | 0.2 |
| | 20 | C | B | B | 0.1 |
| | 23 | B | B | B | 0.2 |
| | 26 | C | B | B | 0.3 |
| | 39 | C | B | B | 0.2 |
| Mo Evaluation result | | | | | |
| Example | 3 | C | B | B | 0.2 |
| | 20 | C | B | B | 0.3 |
| | 23 | A | A | B | 0.2 |
| | 26 | A | A | B | 0.1 |
| | 39 | C | B | B | 0.1 |
| Al Evaluation result | | | | | |
| Example | 3 | B | A | B | Less than 0.1 |
| | 20 | B | A | A | Less than 0.1 |
| | 23 | A | A | A | 0.1 |
| | 26 | A | A | B | 0.2 |
| | 39 | B | A | B | Less than 0.1 |
| Cu Evaluation result | | | | | |
| Example | 3 | B | B | C | 0.1 |
| | 20 | B | B | C | 0.1 |
| | 23 | C | C | B | 0.2 |
| | 26 | A | B | B | 0.2 |
| | 39 | B | B | C | 0.1 |

From the results shown in Table 2, it has been confirmed that even though a substance other than a cobalt-containing substance is used as a first metal-containing substance, the desired results are obtained.

[Test Z]

<Evaluation of Residue Removability (Washing Properties)>

An object to be treated (untreated laminate) comprising a metallic cobalt layer, a SiN film, a $SiO_2$ film, and a barrier metal (TaN) having a predetermined opening portion on a substrate (Si) in this order was formed. By using the barrier metal as a mask, plasma etching (dry etching) was performed on the obtained object to be treated. The SiN film and the $SiO_2$ film were etched until the metallic cobalt layer was exposed and via holes were formed, thereby manufacturing a sample 1 (see FIG. 3). The cross section of the laminate was checked using an image of a scanning electron microscope (SEM). As a result, plasma etching residues (dry etching residues) on the wall surface of the holes were observed.

Then, by the following procedure, residue removability was evaluated. First, a section (about 2.0 cm×2.0 cm) of the prepared sample 1 was immersed in (treated with) each chemical liquid controlled to have a temperature of 60° C. After the lapse of a predetermined time, the section of the sample 1 was taken out and immediately washed with ultrapure water and dried with $N_2$.

<Evaluation of Residue Removability>

The surface of the section of the sample 1 having undergone immersion was observed with SEM, and the removability of the plasma etching residues ("residue removability") was evaluated according to the following standard.

"A": The plasma etching residues were completely removed within 5 minutes.

"B": The plasma etching residues were completely removed within a time that is longer than 5 minutes and 8 minutes or less.

"C": The plasma etching residues were not completely removed even after 8 minutes.

<Evaluation of TaN Member Resistance>

The surface of the section of sample 1 having undergone immersion was observed with SEM, and based on the reduction in the film thickness of the barrier metal (TaN) before and after the treatment performed until the plasma etching residues were completely removed, TaN member resistance was evaluated according to the following standard. Based on the evaluation, it is possible to make a conclusion that the smaller the reduction in the film thickness, the higher the TaN member resistance exhibited in the chemical liquid. The film thickness of the barrier metal (TaN) before the treatment was 3.0 nm.

"A": The reduction in the film thickness of the barrier metal was 0.5 nm or less before and after the treatment.

"B": The reduction in the film thickness of the barrier metal was more than 0.5 nm before and after the treatment.

<Variation Evaluation>

Furthermore, 100 via holes in the sample 1 having undergone immersion were observed with SEM. As a result, until the plasma etching residues were completely removed, the variation in the dissolving amount of the metallic cobalt layer exposed on the bottom portion of the via holes tended to be the same as the variation shown in the results of the test X.

The results of the test Z are shown in the following Table 3.

Each of the example numbers in Table 3 shows that the same chemical liquid as that in the corresponding examples in the test X was used.

For example, in Example 3 in the test Z, the same chemical liquid as that used in Example 3 in Test X was used for the test.

TABLE 4

| Table 3 | | Evaluation result | |
|---|---|---|---|
| | | Residue removability | TaN member resistance |
| Example | 3 | B | A |
| | 20 | A | A |
| | 39 | A | A |

From the results shown in Table 3, it has been confirmed that the chemical liquid according to an embodiment of the present invention is also excellent in the residue removability and TaN member resistance.

Furthermore, it has been confirmed that the residue removability is further improved in a case where the chemical liquid contains a chelating agent.

EXPLANATION OF REFERENCES

20: object to be treated
12: substrate
14: insulating film
16: second metal-containing substance portion
18: first metal-containing substance portion
30: object to be treated
32: substrate
34: metal-containing film
36: etch stop layer
38: interlayer insulating film
40: metal hard mask
42: hole
46: dry etching residue
44: inner wall
44a: cross-sectional wall
44b: bottom wall

What is claimed is:

1. A chemical liquid comprising:
water;
a hydroxylamine compound selected from the group consisting of hydroxylamine and a hydroxylamine salt, and
two or more kinds of specific compounds represented by Formula (1),

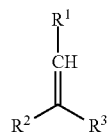

(1)

in Formula (1), $R^1$ to $R^3$ each independently represent a hydrogen atom or a substituent,
one or two $R^1$, $R^2$, or $R^3$ represents a specific substituent containing —CO—NH—, wherein the —CO— of the —CO—NH— is a carbonyl group,
$R^1$ and $R^2$ may be bonded to each other to form an aromatic ring which may have a substituent, and
in a case where $R^1$ and $R^2$ are bonded to each other to form an aromatic ring which may have a substituent, $R^3$ represents the specific substituent,
in a case where $R^1$ and $R^2$ are not bonded to each other to form an aromatic ring which may have a substituent, one or two of $R^1$ to $R^3$ represent a group represented by Formula (2),

-L²-COOH    (2)

in Formula (2), $L^2$ represents a single bond or a divalent linking group that does not contain —CO—NH—,
wherein the chemical liquid comprises both the hydroxylamine compound and the specific compounds of Formula (1), and
a mass ratio of a content of a specific compound which takes up the highest proportion of the specific compounds to a content of a specific compound which takes up the second highest proportion of the specific compounds is 500 or less.

2. The chemical liquid according to claim 1,
wherein a content of the specific compounds is 0.1 ppm by mass to 10% by mass with respect to a total mass of the chemical liquid.

3. The chemical liquid according to claim 1,
wherein a content of the specific compounds is 0.01% to 1% by mass with respect to a total mass of the chemical liquid.

4. The chemical liquid according to claim 1,
wherein
the mass ratio of the content of the specific compound which takes up the highest proportion of the specific compounds to the content of the specific compound which takes up the second highest proportion of the specific compounds is 50 or less.

5. The chemical liquid according to claim 1, wherein the specific substituent is a group containing —CO—NH—OH.

6. The chemical liquid according to claim 1, wherein one of $R^1$ to $R^3$ represents the specific substituent and the other two represent a group represented by the Formula (2).

7. The chemical liquid according to claim 1, wherein a content of the hydroxylamine compound is 0.1% to 18% by mass with respect to a total mass of the chemical liquid.

8. The chemical liquid according to claim 1, wherein a mass ratio of a content of the hydroxylamine compound to a content of the specific compounds is $2.0 \times 10^4$ to $1.5 \times 10^5$.

9. The chemical liquid according to claim 1, further comprising:
a chelating agent which is a compound other than the specific compounds.

10. The chemical liquid according to claim 9, wherein a content of the chelating agent is 0.1% to 15% by mass with respect to a total mass of the chemical liquid.

11. The chemical liquid according to claim 9, wherein a content of the chelating agent is more than 0.2% by mass and 1% by mass or less with respect to a total mass of the chemical liquid.

12. The chemical liquid according to claim 9, wherein a mass ratio of a content of the chelating agent to a content of the specific compounds is $1.0 \times 10^0$ to $5.0 \times 10^5$.

13. The chemical liquid according to claim 9, wherein a mass ratio of a content of the chelating agent to a content of the specific compounds is $7.0 \times 10^0$ to $5.0 \times 10^1$.

14. The chemical liquid according to claim 9, wherein the chelating agent has a functional group selected from the group consisting of a carboxylic acid group, a phosphonic acid group, and a sulfonic acid group.

15. The chemical liquid according to claim 9, wherein the chelating agent is selected from the group consisting of citric acid, diethylenetriaminepentaacetic acid, ethylenediaminetetraacetic acid, trans-1,2-diaminocyclohexanetetraacetic acid, oxalic acid, malonic acid, succinic acid, methanesulfonic acid, 1-hydroxyethylidene-1,1-diphosphonic acid, and nitrilotrismethylenephosphonic acid.

16. The chemical liquid according to claim 9, wherein the chelating agent is citric acid.

17. A method for treating an object to be treated, comprising:
bringing an object to be treated containing a first metal-containing substance containing a metal selected from the group consisting of cobalt, ruthenium, molybdenum, aluminum, and copper into contact with the chemical liquid according to claim 1 so that the first metal-containing substance is dissolved.

18. The method for treating an object to be treated according to claim 17, comprising:
a step A of bringing the object to be treated containing the first metal-containing substance and a second metal-containing substance which is a material different from the first metal-containing substance and contains a metal into contact with the chemical liquid so that the first metal-containing substance is dissolved; and
a step B of bringing the object to be treated into contact with a solution selected from the group consisting of a mixed aqueous solution of ammonia and aqueous hydrogen peroxide, a mixed aqueous solution of hydrofluoric acid and aqueous hydrogen peroxide, a mixed aqueous solution of sulfuric acid and aqueous hydrogen peroxide, and a mixed aqueous solution of hydrochloric acid and aqueous hydrogen peroxide before or after the step A so that the second metal-containing substance is dissolved.

19. The method for treating an object to be treated according to claim 18, wherein the step A and the step B are alternately repeated.

20. The method for treating an object to be treated according to claim 17, wherein a temperature of the chemical liquid is 20° C. to 75° C.

21. A method for treating an object to be treated, comprising:
bringing the chemical liquid according to claim 1 into contact with an object to be treated containing a first metal-containing substance which contains a metal selected from the group consisting of cobalt, ruthenium, molybdenum, aluminum, and copper and dry etching residues which are on a surface of the object to be treated, so that the first metal-containing substance is dissolved, and the dry etching residues on the surface of the object to be treated are removed.

22. A chemical liquid comprising:
water;
a hydroxylamine compound selected from the group consisting of hydroxylamine and a hydroxylamine salt, and
two or more kinds of specific compounds selected from the group consisting of the following compounds,

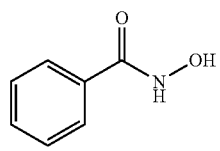
Benzohydroxamic acid

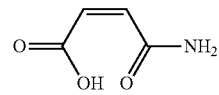
Maleic acid monoamide

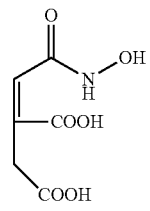
Compound A

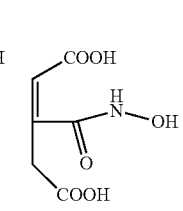
Compound B

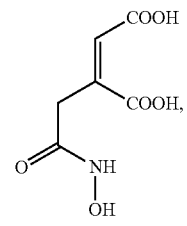
Compound C wherein the chemical liquid comprises both the hydroxylamine compound and the specific compounds selected from the group consisting of the above compounds, and
a mass ratio of a content of a specific compound which takes up the highest proportion of the specific compounds to a content of a specific compound which takes up the second highest proportion of the specific compounds is 500 or less.

23. The chemical liquid according to claim 22, wherein the specific compounds are selected from the group consisting of the following compounds:
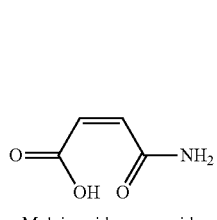
Maleic acid monoamide
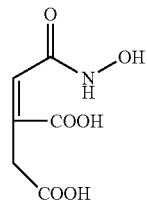
Compound A
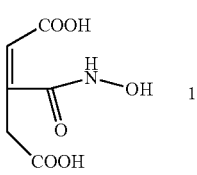
Compound B
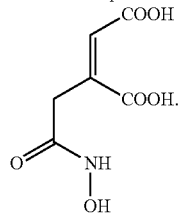
Compound C